(12) United States Patent
Kim

(10) Patent No.: US 12,256,566 B2
(45) Date of Patent: Mar. 18, 2025

(54) SEMICONDUCTOR DEVICE CHANNEL LAYERS STACKED VERTICALLY AND METHOD OF FABRICATING THE SAME

(71) Applicant: Samsung Electronics Co., Ltd., Suwon-si (KR)

(72) Inventor: Jinbum Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 17/714,450

(22) Filed: Apr. 6, 2022

(65) Prior Publication Data

US 2023/0071231 A1    Mar. 9, 2023

(30) Foreign Application Priority Data

Sep. 7, 2021    (KR) .................. 10-2021-0118770

(51) Int. Cl.
*H10D 64/23* (2025.01)
*H10D 30/01* (2025.01)
(Continued)

(52) U.S. Cl.
CPC ....... *H10D 64/258* (2025.01); *H10D 30/0321* (2025.01); *H10D 30/6713* (2025.01);
(Continued)

(58) Field of Classification Search
CPC .............. H01L 29/41775; H01L 29/401; H01L 29/41733; H01L 29/42392; H10D 64/258; H10D 30/0321
(Continued)

(56) References Cited

U.S. PATENT DOCUMENTS 5,937,315 A    8/1999  Kiang et al.
7,423,309 B2   9/2008  Park et al.
(Continued)

FOREIGN PATENT DOCUMENTS

KR    1020080042262 A    5/2008
KR    1020090098286 A    9/2009

OTHER PUBLICATIONS

Brendan M. Kayes et al., Harry. Growth of vertically aligned Si wire arrays over large areas with Au and Cu catalysts. Applied Physics Letters, 2007, vol. 91, 103110.
(Continued)

*Primary Examiner* — Quoc D Hoang
(74) *Attorney, Agent, or Firm* — Muir Patent Law, PLLC

(57) ABSTRACT

A semiconductor device includes an active pattern on a substrate, source/drain patterns on the active pattern, a plurality of channel layers stacked on the active pattern to be vertically spaced apart from each other and connecting the source/drain patterns with each other, a gate electrode between the source/drain patterns to cross the active pattern and to surround the channel layers, and active contacts at opposite sides of the gate electrode to cover top surfaces of the source/drain patterns. A width of each of the active contacts is smaller than or equal to the largest width of each of the source/drain patterns. Each of the top surfaces of the source/drain patterns has an inclined surface that is inclined relative to a top surface of the substrate, and each of the active contacts includes a protruding portion that protrudes toward the inclined surface.

14 Claims, 44 Drawing Sheets

(51) Int. Cl.
*H10D 30/67* (2025.01)
*H10D 64/01* (2025.01)

(52) U.S. Cl.
CPC ..... *H10D 30/6729* (2025.01); *H10D 30/6735* (2025.01); *H10D 30/6757* (2025.01); *H10D 64/01* (2025.01)

(58) Field of Classification Search
USPC .......................................................... 257/288
See application file for complete search history.

(56) References Cited

U.S. PATENT DOCUMENTS

| | | | |
|---|---|---|---|
| 7,501,331 | B2 | 3/2009 | Herner |
| 7,521,303 | B2 | 4/2009 | Paik |
| 7,932,138 | B2 | 4/2011 | Kim et al. |
| 8,790,967 | B2 | 7/2014 | Park et al. |
| 8,860,176 | B2 | 10/2014 | Fritz et al. |
| 9,318,329 | B2 | 4/2016 | Kohji et al. |
| 9,449,981 | B2 | 9/2016 | Pachamuthu et al. |
| 9,837,500 | B2 | 12/2017 | Lee et al. |
| 9,847,390 | B1 | 12/2017 | Xie et al. |
| 9,978,604 | B2 | 5/2018 | Lin et al. |
| 2005/0105037 | A1 | 5/2005 | Kim et al. |
| 2008/0200014 | A1 | 8/2008 | Park et al. |
| 2008/0296565 | A1 | 12/2008 | Park et al. |
| 2010/0323489 | A1 | 12/2010 | Park et al. |
| 2015/0004777 | A1 | 1/2015 | Kohji et al. |
| 2017/0222008 | A1* | 8/2017 | Hsu .................. H01L 21/76849 |
| 2021/0115334 | A1 | 4/2021 | Song et al. |
| 2021/0193829 | A1* | 6/2021 | Reznicek ............ H01L 29/0847 |

OTHER PUBLICATIONS

V. Schmidt et al., Growth, Thermodynamics, and Electrical Properties of Silicon Nanowires, Chemical reviews, 2010, vol. 110, 361-388.

* cited by examiner

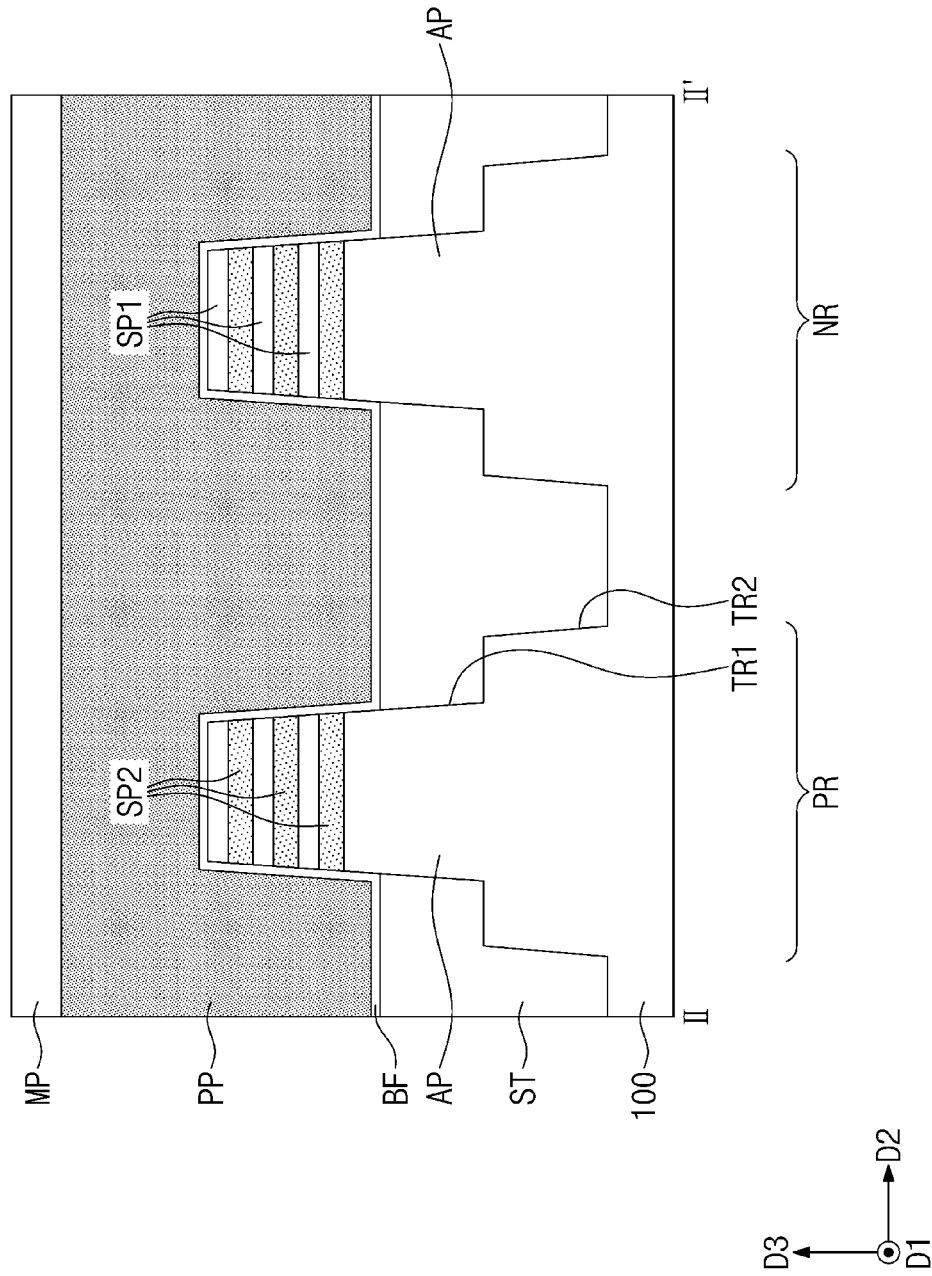

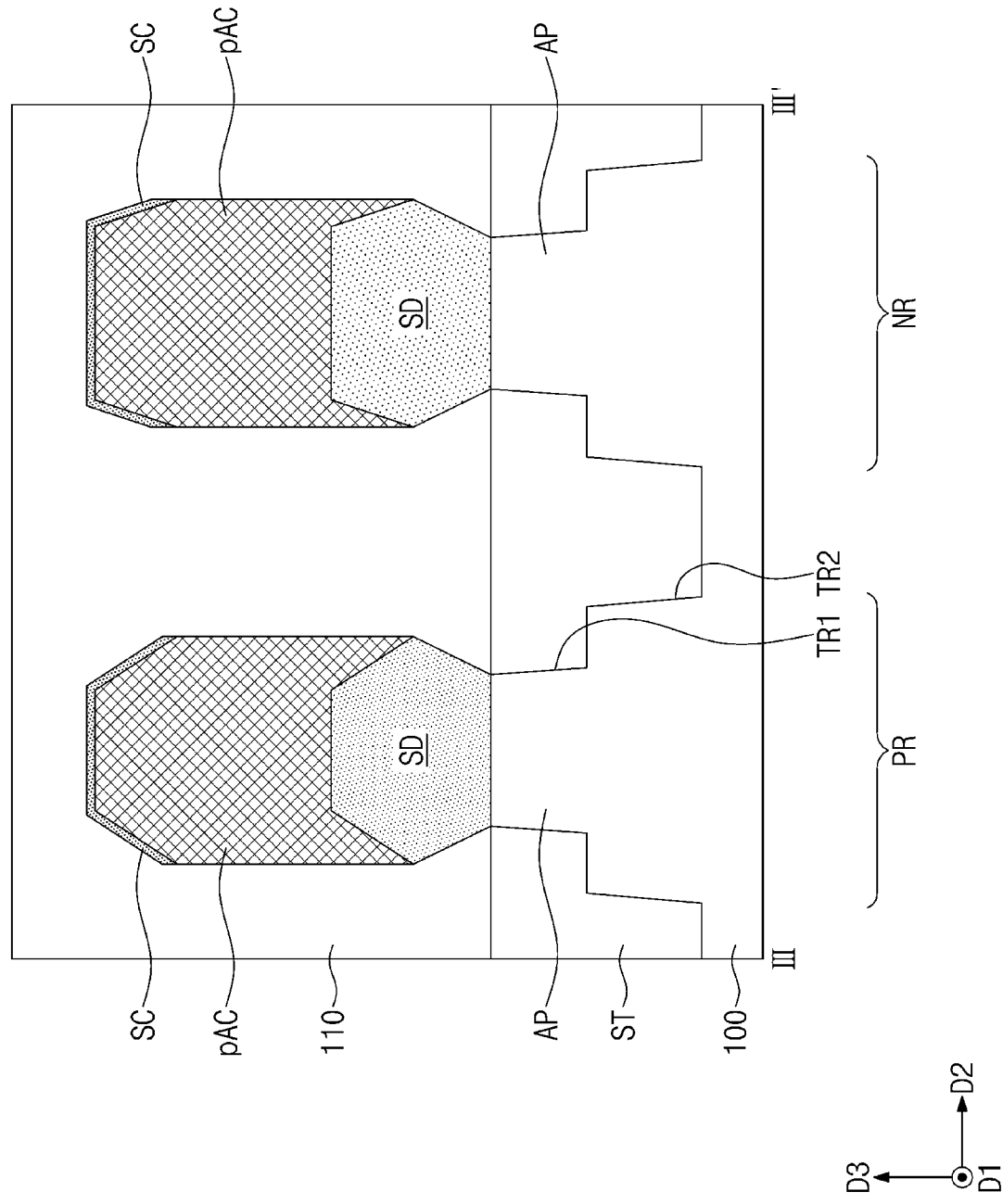

SEMICONDUCTOR DEVICE CHANNEL LAYERS STACKED VERTICALLY AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0118770, filed on Sep. 7, 2021, in the Korean Intellectual Property Office, the entire contents of which are hereby incorporated by reference.

BACKGROUND OF THE INVENTION

The present disclosure relates to a semiconductor device, and in particular, a semiconductor device including a field effect transistor and a method of fabricating the same.

A semiconductor device includes an integrated circuit including metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may cause deterioration in operational properties of the semiconductor device. A variety of studies are being conducted to overcome technical limitations associated with the scale-down of the semiconductor device and to realize the semiconductor devices with high performance.

SUMMARY

An embodiment of the inventive concept provides a semiconductor device with improved reliability and electrical characteristics and a method of fabricating the same.

According to an embodiment of the present invention, a semiconductor device includes an active pattern extending in a first direction on a substrate, a pair of source/drain patterns provided on the active pattern and spaced apart from each other in the first direction, a plurality of channel layers stacked on the active pattern to be vertically spaced apart from each other and to connect the pair of source/drain patterns with each other, a gate electrode provided at the active pattern between the pair of source/drain patterns, the gate electrode extending in a second direction intersecting the first direction and surrounding each of the plurality of channel layers, and a pair of active contacts provided at opposite sides of the gate electrode to cover inclined top surfaces, relative to a top surface of the substrate, of the pair of source/drain patterns, respectively. A width, in the second direction, of each of the pair of active contacts is smaller than or equal to a maximum width, in the second direction, of a corresponding source/drain pattern of the pair of source/drain patterns. Each of the pair of active contacts comprises a protruding portion that protrudes toward and extends along an inclined top surface of a corresponding source/drain pattern of the pair of source/drain patterns.

According to an embodiment of the present invention, a method of fabricating a semiconductor device includes forming an active pattern including a plurality of first semiconductor patterns and a plurality of second semiconductor patterns alternately stacked on a substrate, forming a sacrificial pattern on the active pattern, forming a pair of source/drain patterns at opposite sides of the sacrificial pattern, respectively, and in an upper portion of the active pattern, selectively forming a pair of silicide patterns on top surfaces of the pair of source/drain patterns, respectively, forming a pair of preliminary active contacts through a metal-induced crystallization process based on the pair of silicide patterns, respectively, wherein each preliminary active contact of the pair of preliminary active contacts is formed between a corresponding silicide pattern of the pair of silicide patterns and a corresponding source/drain pattern of the pair of source drain patterns, forming an interlayer insulating layer to cover the pair of silicide patterns and the pair of preliminary active contacts, performing a planarization process to remove a portion of the interlayer insulating layer and the pair of silicide patterns and to expose the sacrificial pattern, selectively removing the sacrificial pattern and the plurality of second semiconductor patterns, forming a gate electrode to fill a space, which is formed by removing the sacrificial pattern and the plurality of second semiconductor patterns, and replacing the pair of preliminary active contacts, which are located at opposite sides of the gate electrode, with a pair of active contacts, respectively.

According to an embodiment of the present invention, a semiconductor device includes an active pattern extending in a first direction on a substrate, a pair of source/drain patterns provided on the active pattern and spaced apart from each other in the first direction, a plurality of channel layers stacked on the active pattern to be vertically spaced apart from each other and connecting the pair of source/drain patterns with each other, a gate electrode provided at the active pattern between the pair of source/drain patterns, the gate electrode extending in a second direction intersecting the first direction, and surrounding each of the plurality of channel layers, a pair of active contacts provided at opposite sides of the gate electrode and covering top surfaces of the pair of source/drain patterns, respectively, a gate insulating pattern interposed between the gate electrode and each of the plurality of channel layers, a pair of first gate spacers extending vertically from a top surface of an uppermost channel layer of the plurality of channel layers and covering opposite side surfaces of the gate electrode, respectively, a plurality of second gate spacers provided between each of the pair of source/drain patterns and the gate electrode and vertically overlapped with the pair of first gate spacers, a gate capping pattern provided between the pair of first gate spacers and covering a top surface of the gate electrode, an interlayer insulating layer covering side and top surfaces of the pair of active contacts, and a gate contact provided to penetrate the gate capping pattern and the interlayer insulating layer and connected to the gate electrode. A width, in the first direction, of each of the pair of active contacts is smaller than a maximum width, in the first direction, of a corresponding source/drain pattern of the pair of source/drain patterns. A width, in the second direction, of each of the pair of active contacts is smaller than or equal to a maximum width, in the second direction, of a corresponding source/drain pattern of the pair of source/drain patterns. Side surfaces of the pair of active contacts extend in a third direction perpendicular to a top surface of the substrate and cover side surfaces of the pair of first gate spacers, respectively.

BRIEF DESCRIPTION OF THE DRAWINGS

FIGS. 5C, 6C, 12B, and 13C are sectional views, each of which is taken along line II-IF of one of FIGS. 5A, 6A, 7A, and 13A to illustrate a method of fabricating a semiconductor device according to an embodiment of the inventive concept.

FIGS. 6D, 7C, 8B, 9B, 10B, 11B, 12C, 14B, 15B, 16B, and 17B are sectional views, each of which is taken along line of one of FIGS. 5A, 6A, 7A, and 13A to illustrate a method of fabricating a semiconductor device according to an embodiment of the inventive concept.

DETAILED DESCRIPTION

Example embodiments of the inventive concepts will now be described more fully with reference to the accompanying drawings, in which example embodiments are shown.

Figure 1A:
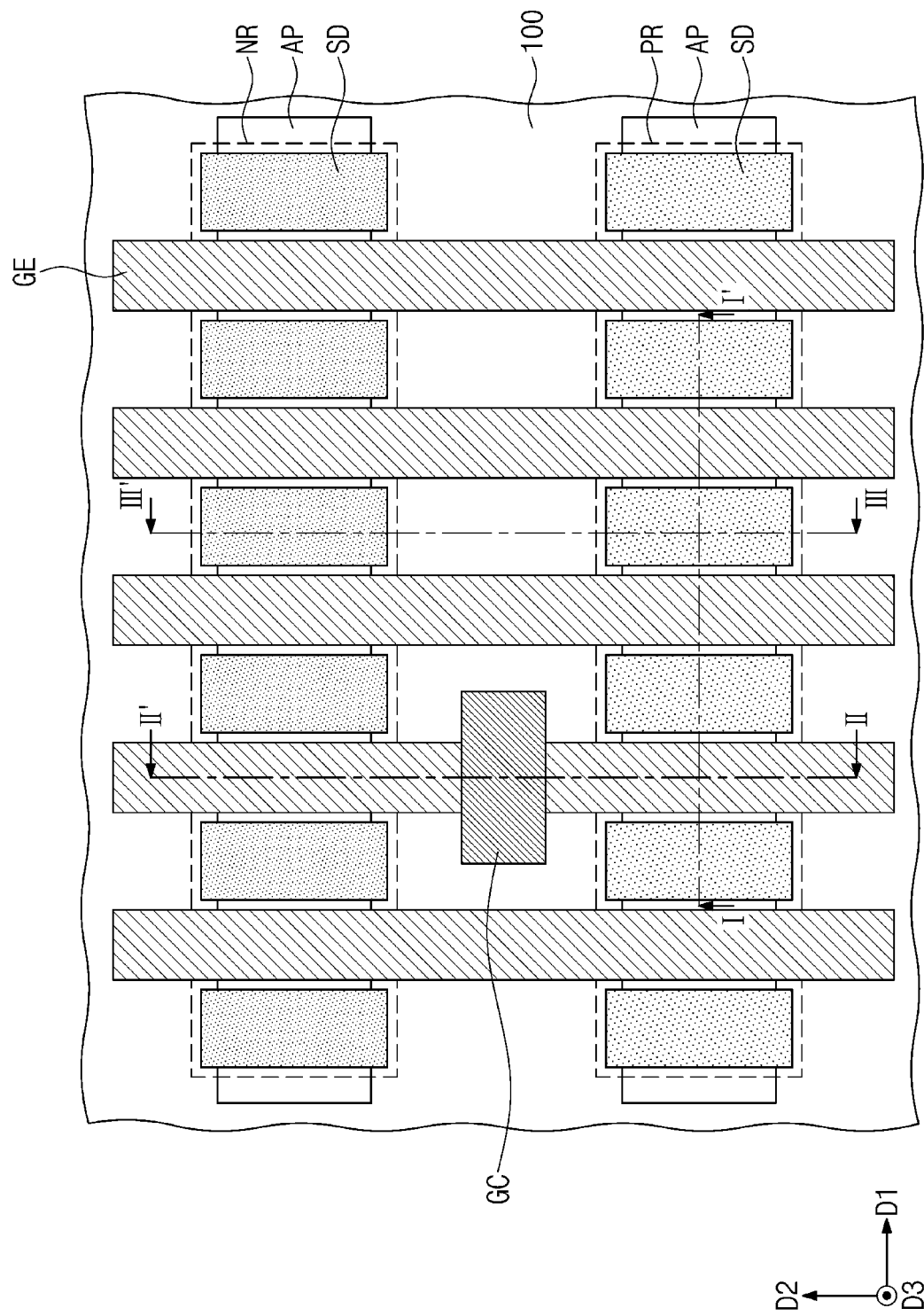
FIG. 1A is a plan view illustrating a semiconductor device according to an embodiment of the inventive concept.
Figure 1B:
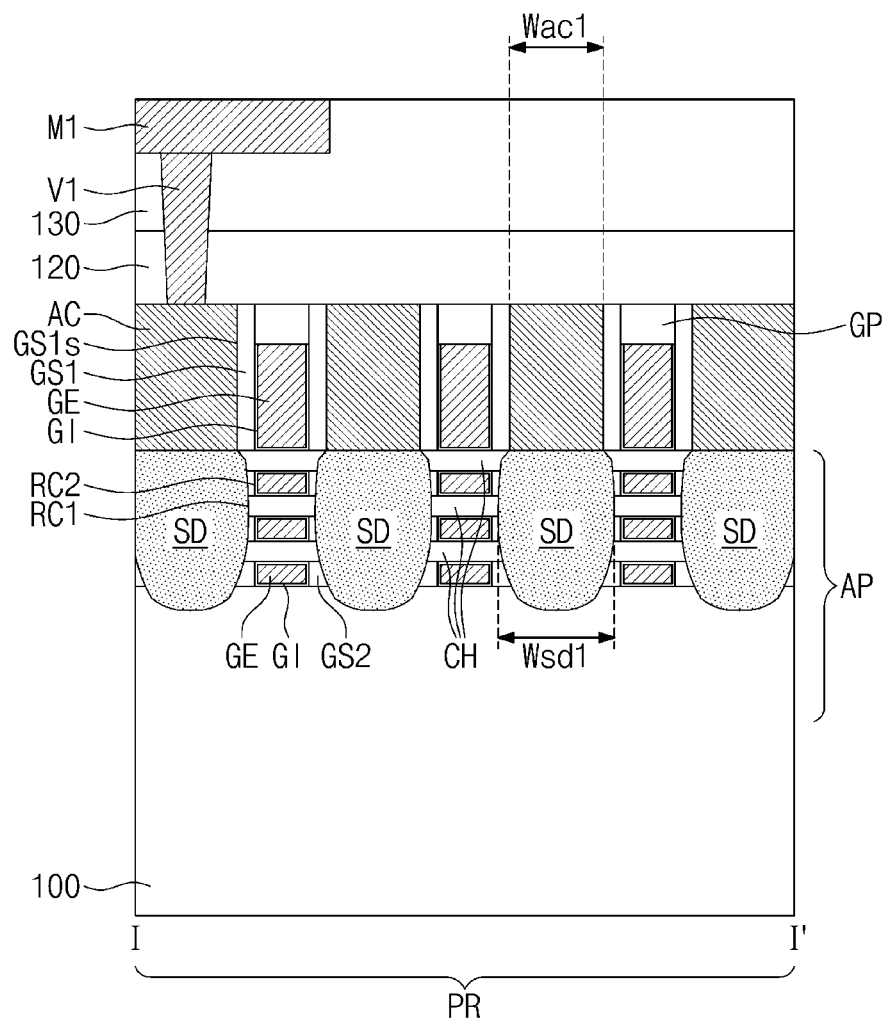
FIGS. 1B, 1C, and 1D are sectional views, which are respectively taken along lines I-I', and of FIG. 1A to illustrate a semiconductor device according to an embodiment of the inventive concept.
Figure 1C:
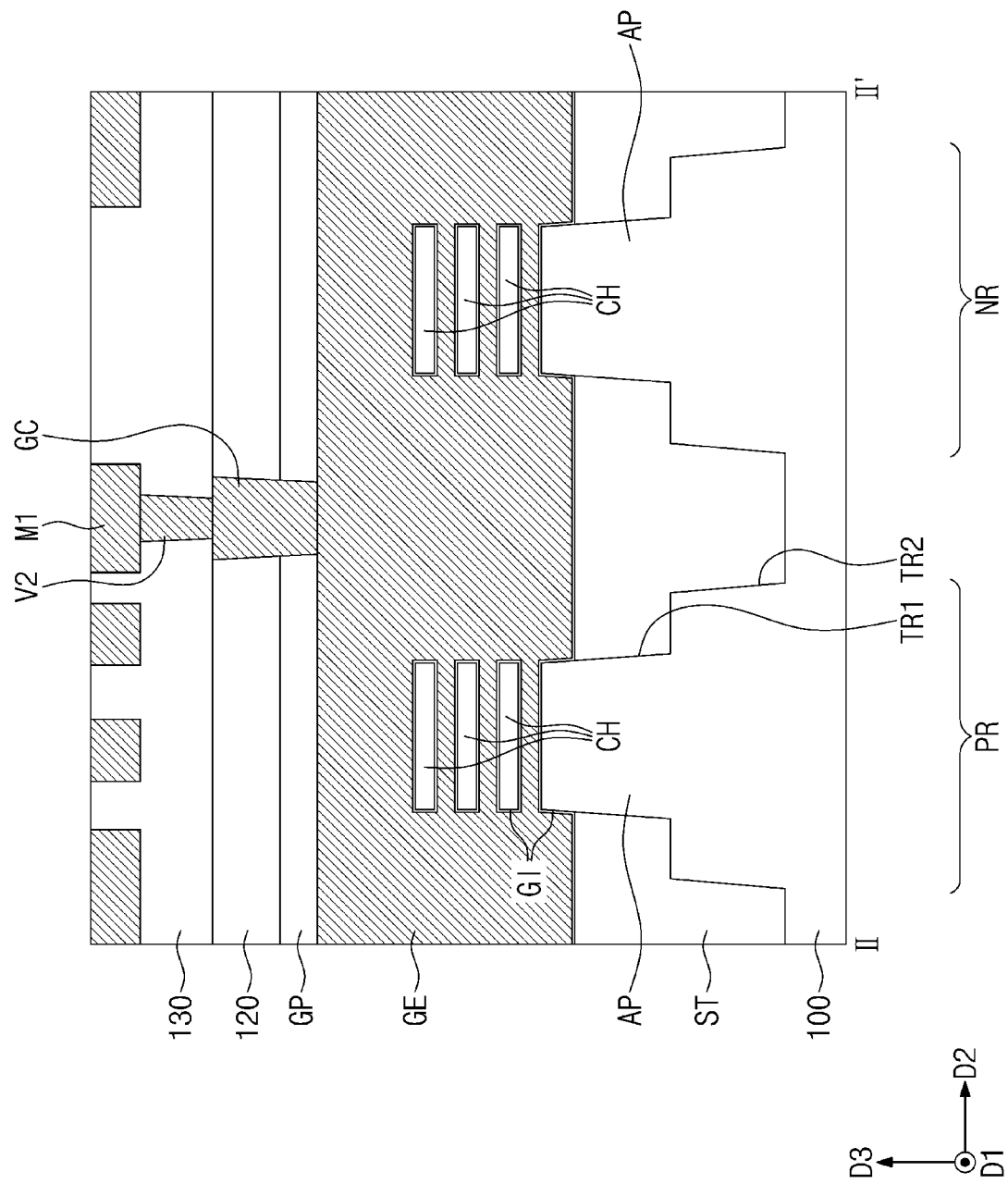
Figure 1D:
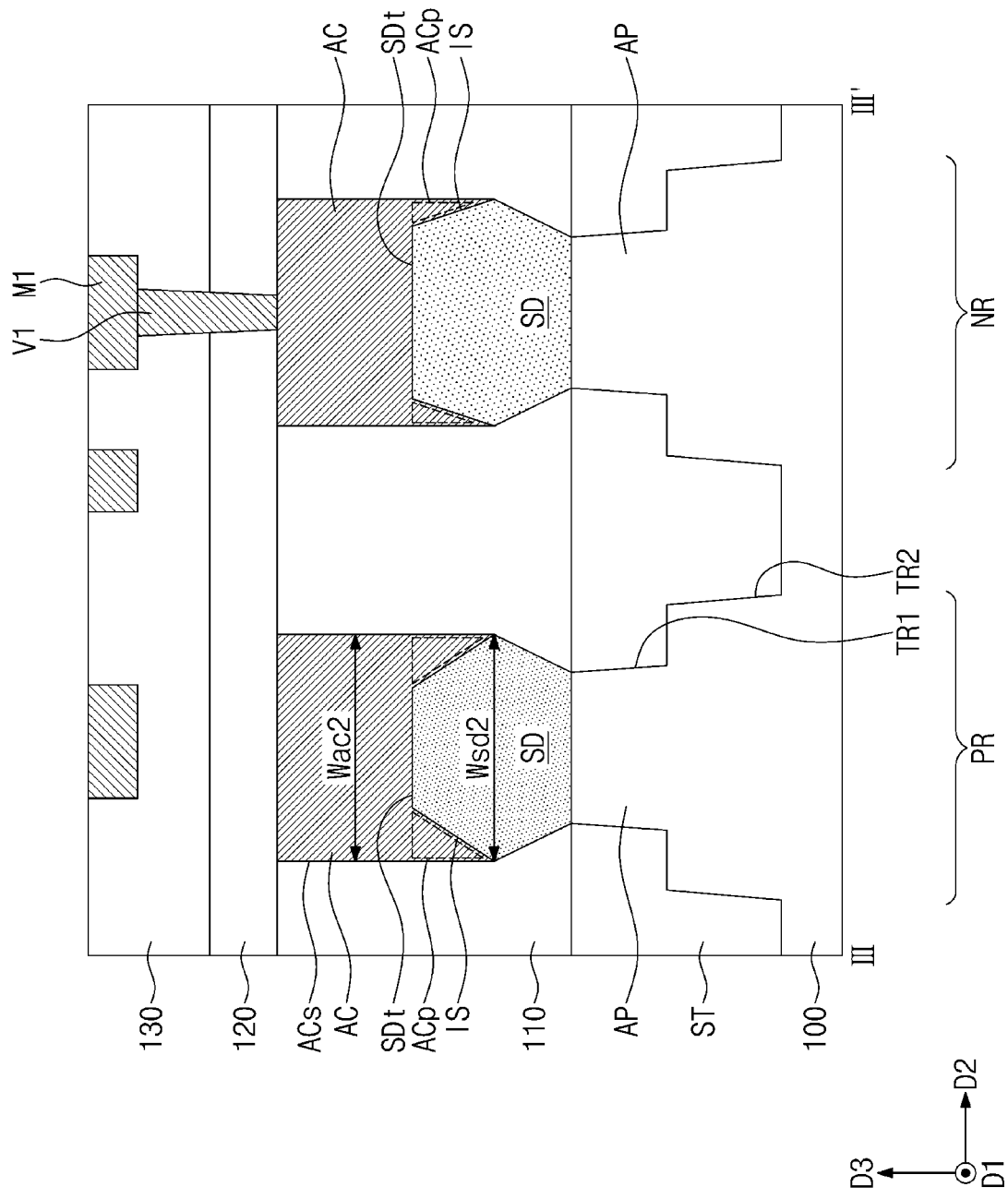

FIG. 1A is a plan view illustrating a semiconductor device according to an embodiment of the inventive concept. FIGS. 1B, 1C, and 1D are sectional views, which are respectively taken along lines I-I', and of FIG. 1A to illustrate a semiconductor device according to an embodiment of the inventive concept.

Referring to FIGS. 1A, 1B, 1C, and 1D, a substrate 100 including a first cell region PR and a second cell region NR may be provided. The substrate 100 may include or may be a semiconductor substrate, which is formed of or includes one of silicon (Si), germanium (Ge), silicon-germanium (SiGe), and a compound semiconductor substrate. In an embodiment, the substrate 100 may be a silicon wafer. A top surface of the substrate 100 may be parallel to a first direction D1 and a second direction D2 and may be perpendicular to a third direction D3. The first direction D1, the second direction D2, and the third direction D3 may be perpendicular to each other.

A second trench TR2 may be formed in an upper portion of the substrate 100 to define the first and second cell regions PR and NR. The second trench TR2 may be placed between the first and second cell regions PR and NR. The first and second cell regions PR and NR may be spaced apart from each other in the second direction D2 with the second trench TR2 interposed therebetween.

The first and second cell regions PR and NR may be regions, in which a standard logic cell constituting a logic circuit is provided. As an example, the first cell region PR may be a region, in which PMOS field effect transistors are provided, and the second cell region NR may be a region, in which NMOS field effect transistors are provided. As used herein, the term "standard logic cell" may refer to a unit circuit configured to perform a single logical operation and be composed of a plurality of interconnected MOSFETs. Examples of logic cells include a NAND gate, a NOR gate, an inverter, and a latch. In addition, it will be apparent that the invention is not limited to one or a plurality of logic cells, but may be implemented in connection with one or more transistors, a portion of a transistor, an integrated circuit (e.g., comprising a plurality of interconnected logic cell), a semiconductor chip, or a plurality of semiconductor chips (e.g., stacked in a package).

A first trench TR1 may be formed in an upper portion of the substrate 100 to define active patterns AP. The active patterns AP may be provided on the first cell region PR and the second cell region NR. The first trench TR1 may be shallower than the second trench TR2. The active patterns AP may extend in the first direction D1 and may be spaced apart from each other in the second direction D2. The active patterns AP may be portions of the substrate 100 protruding in the third direction D3. Widths of the active patterns AP in the first and second directions D1 and D2 may decrease in the third direction D3.

A device isolation layer ST may be provided to fill the first and second trenches TR1 and TR2. The device isolation layer ST may be formed of or may include silicon oxide. An upper portion of each of the active patterns AP may protrude above the device isolation layer ST. The device isolation layer ST may not cover the upper portion of each of the active patterns AP. The device isolation layer ST may partially cover a side surface of each of the active patterns AP.

Each of the active patterns AP may include a plurality of channel layers CH which are stacked on each other. The channel layers CH may be provided in an upper portion of each of the active patterns AP. The channel layers CH may be spaced apart from each other in the third direction D3. The channel layers CH may be formed of or may include at least one of, for example, silicon (Si), germanium (Ge), and silicon germanium (SiGe). As an example, the channel layers CH may be formed of or may include silicon (Si).

Source/drain patterns SD may be provided in the upper portion of each of the active patterns AP. As an example, the source/drain patterns SD may be impurity regions of a first conductivity type (e.g., p-type) or impurity regions of a second conductivity type (e.g., n-type). The channel layers CH may be provided between a pair of the source/drain patterns SD. The source/drain patterns SD may be epitaxial patterns which are formed by a selective epitaxial growth process.

The source/drain patterns SD may be formed of or may include a semiconductor material (e.g., SiGe), which has a lattice constant greater than a lattice constant of the substrate 100, or the same semiconductor material (e.g., Si) as the substrate 100. The source/drain patterns SD may exert a compressive stress on the channel layers CH.

A gate electrode GE may be provided to cross the active patterns AP or to extend in the second direction D2. In an embodiment, a plurality of gate electrodes GE may be provided. The gate electrodes GE may be spaced apart from each other in the first direction D1. Hereinafter, just one gate electrode GE will be described below, for brevity's sake, but the others may also have substantially the same features as those described below.

A portion of the gate electrode GE may be overlapped with the channel layers CH in the third direction D3. The gate electrode GE may include a first portion, which is provided on the uppermost one of the channel layers CH, and second portions, which are provided between the source/drain patterns SD. Each of the second portions of the gate electrode GE may be provided between the channel layers CH to extend parallel to a bottom surface of the first portion of the gate electrode GE or in the second direction D2. The gate electrode GE may be provided to cover top, bottom, and side surfaces of each of the channel layers CH. Each of transistors on the first and second cell regions PR and NR may be a three-dimensional field effect transistor (e.g., a gate-all-around (GAA) type transistor), in which the gate electrode GE is provided to three-dimensionally surround the channel layers CH, for example, each of the channel layers CH.

The gate electrode GE may be formed of or may include at least one of, for example, doped semiconductor materials, conductive metal nitride materials, and metallic materials. In some embodiments, the gate electrode GE may include a plurality of different metal patterns. The metal patterns may have different electric resistances from each other. By adjusting a composition and/or thickness of each of the metal patterns, a transistor having a desired threshold voltage may be formed.

First gate spacers GS1 and second gate spacers GS2 may be provided to cover side surfaces of the gate electrode GE. Each of the first gate spacers GS1 may extend along a side surface of the gate electrode GE or in the second direction D2. Each of the first gate spacers GS1 may extend from the top surface of the uppermost one of the channel layers CH of the gate electrode GE in the third direction D3. Each of the first gate spacers GS1 may have a top surface that is located at a level higher than the uppermost surface of the gate electrode GE. The top surface of each of the first gate spacers GS1 may be substantially coplanar with a top surface of a gate capping pattern GP, which will be described below. The first gate spacers GS1 may be formed of or may include at least one of nitride-based insulating materials. For example, the first gate spacers GS1 may be formed of or may include at least one of SiCN, SiCON, and SiN. In an embodiment, the first gate spacers GS1 may have a multilayered structure including at least two layers, each of which may be formed of SiCN, SiCON, or SiN. It will be appreciated that "planarization," "co-planar," "planar," etc., as used herein refer to structures (e.g., surfaces) that need not be perfectly geometrically planar, but may include acceptable variances that may result from standard manufacturing processes.

The second gate spacers GS2 may be provided between the gate electrode GE and the source/drain patterns SD in a horizontal direction. The second gate spacers GS2 may be vertically provided between the channel layers CH and may be overlapped with the first gate spacers GS1 in the third direction D3. The gate electrode GE may be spaced apart from the source/drain patterns SD in the first direction D1, with the second gate spacers GS2 interposed therebetween.

A gate capping pattern GP may be provided on the gate electrode GE. The gate capping pattern GP may extend along the gate electrode GE or in the second direction D2. The gate capping pattern GP may be formed of or may include a material that is chosen to have etch selectivity with respect to first and second interlayer insulating layers 110 and 120, which will be described below. For example, the gate capping pattern GP may be formed of or may include at least one of SiON, SiCN, SiCON, and SiN.

A gate insulating pattern GI may be interposed between the gate electrode GE and the channel layers CH. The gate insulating pattern GI may extend into regions between the gate electrode GE and the first gate spacers GS1 and between the gate electrode GE and the second gate spacers GS2. The uppermost surface of the gate insulating pattern GI may be substantially coplanar with the uppermost surface of the gate electrode GE. The gate electrode GE may be spaced apart from the first and second gate spacers GS1 and GS2, with the gate insulating pattern GI interposed therebetween.

The gate insulating pattern GI may be formed of or may include at least one of, for example, silicon oxide, silicon nitride, silicon oxynitride, and a high-k dielectric material. The high-k dielectric material may include hafnium oxide (HfO), aluminum oxide (AlO), or tantalum oxide (TaO) whose dielectric constants are higher than a dielectric constant of each of silicon oxide and silicon nitride.

A first interlayer insulating layer 110 may be provided on the substrate 100. The first interlayer insulating layer 110 may cover side surfaces of the source/drain patterns SD and side surfaces ACs of active contacts AC, which will be described below. A top surface of the first interlayer insulating layer 110 may be located at substantially the same level as a top surface of the gate capping pattern GP and top surfaces of the first gate spacers GS1. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The active contacts AC may be provided to penetrate the first interlayer insulating layer 110 and may be electrically and respectively connected to the source/drain patterns SD. A pair of the active contacts AC may be provided at opposite sides of the gate electrode GE, respectively.

Referring to FIG. 1B, each of the active contacts AC may be provided to fully cover side surfaces GS1s of the first gate spacers GS1. Each of the active contacts AC may fill a space, which is delimited by a top surface of the source/drain pattern SD and the side surfaces GS1s of the first gate spacers GS1 facing each other. A width Wac1 of each of the active contacts AC in the first direction D1 may be smaller than the largest width Wsd1 of each of the source/drain patterns SD in the first direction D1. The width Wac1 of each of the active contacts AC in the first direction D1 may be substantially equal to a distance between the first gate spacers GS1 facing each other. In an embodiment, the width Wac1 of each of the active contacts AC in the first direction D1 may decrease in the third direction D3, and here, the first interlayer insulating layer 110 may be provided between each of the active contacts AC and the first gate spacers GS1. The active contacts AC may have top surfaces that are substantially coplanar with the top surface of the gate capping pattern GP and the top surfaces of the first gate spacers GS1.

Referring to FIG. 1D, the active contacts AC may cover top surfaces SDt of the source/drain patterns SD. A width Wac2 of each of the active contacts AC in the second direction D2 may be smaller than or equal to the largest width Wsd2 of each of the source/drain patterns SD in the second direction D2. In an embodiment, the width Wac2 of each of the active contacts AC in the second direction D2 may be substantially equal to the largest width Wsd2 of each of the source/drain patterns SD in the second direction D2. The side surfaces Acs of the active contacts AC may be parallel to the third direction D3. The side surfaces Acs of the active contacts AC may be covered with the first interlayer insulating layer 110. The active contacts AC may be spaced apart from the active patterns AP, in the third direction D3, with the source/drain patterns SD interposed therebetween. For example, the active contacts AC may not be in contact with (i.e., may be spaced apart from) the active patterns AP. The top surfaces of the active contacts AC may be substantially coplanar with the top surface of the first interlayer insulating layer 110.

Each of the top surfaces SDt of the source/drain patterns SD may include an inclined surface IS that is inclined at an angle to the top surface of the substrate 100. The inclined surface IS may have a slope relative to each of the side surfaces Acs of the active contacts AC. Each of the active contacts AC may include at least one protruding portion Acp that protrudes toward the inclined surface IS of each of the top surfaces SDt of the source/drain patterns SD. The protruding portion Acp may be in contact with the first interlayer insulating layer 110. A profile of each of bottom surfaces of the active contacts AC including the protruding portion Acp may correspond to a profile of each of the top surfaces SDt of the source/drain patterns SD.

Each of the active contacts AC may be formed of or may include at least one of metallic materials (e.g., aluminum, copper, tungsten, molybdenum, and cobalt). In an embodiment, each of the active contacts AC may further include a barrier pattern covering side and bottom surfaces thereof. The barrier pattern may be formed of or may include at least one of metallic materials (e.g., titanium, tantalum, tungsten, nickel, cobalt, and platinum) or at least one of metal nitride materials (e.g., titanium nitride (TiN), tantalum nitride (TaN), tungsten nitride (WN), nickel nitride (NiN), cobalt nitride (CoN), and platinum nitride (PtN)).

In an embodiment, each of the active contacts AC may be formed of or may include at least one of metal-silicide materials. In an embodiment, each of the active contacts AC may be formed of or may include highly doped semiconductor materials (e.g., silicon (Si) or germanium (Ge)). Each of the active contacts AC may electrically connect a first via V1, which will be described below, to one of the source/drain patterns SD.

The active contacts AC may be self-aligned contacts. For example, the active contacts AC may be formed by a self-alignment process using the first gate spacers GS1. As will be described below, the active contacts AC (or preliminary active contacts pAC) may be formed by a metal-induced crystallization (MIC) process using a silicide pattern SC (e.g., see FIGS. 9A and 9B) formed on the source/drain patterns SD, and thus, the active contacts AC may be formed in a more-accurately self-aligned manner. The increase of the alignment accuracy may lead to reduction in electric resistance between the source/drain patterns SD and the active contacts AC and an increase in margin (i.e., margin in design rule or spacing margin) between the active contacts AC and a gate contact GC. Accordingly, it may be possible to improve reliability and electrical characteristics of a semiconductor device.

A second interlayer insulating layer 120 may be provided on the first interlayer insulating layer 110 to cover the top surface of the gate capping pattern GP, the top surfaces of the first gate spacers GS1, and the top surfaces of the active contacts AC.

The gate contact GC may be provided to penetrate the second interlayer insulating layer 120 and the gate capping pattern GP and may be electrically connected to the gate electrode GE. For example, the gate contact GC may be provided on the device isolation layer ST between the first and second cell regions PR and NR. When viewed in a plan view, the gate contact GC may be a bar shaped pattern extending in the first direction D1. The gate contact GC may include a conductive pattern and a barrier pattern enclosing the conductive pattern.

A third interlayer insulating layer 130 may be provided on the second interlayer insulating layer 120. First interconnection lines M1, a first via V1, and a second via V2 may be provided in the third interlayer insulating layer 130. The first and second vias V1 and V2 may be provided below the first interconnection lines M1. The first interconnection lines M1 may extend in the first direction D1. The first interconnection lines M1 may be arranged in the first direction D1 or in the second direction D2. The first via V1 may be provided between one of the first interconnection lines M1 and one of the active contacts AC to electrically connect them to each other. The first via V1 may extend from an inner region of the third interlayer insulating layer 130 into the second interlayer insulating layer 120 and may be connected to the top surface of each of the active contacts AC. The second via V2 may be provided between one of the first interconnection lines M1 and the gate contact GC to electrically connect them to each other.

The first interconnection line M1 and the first or second via V1 or V2 may be connected to form a single conductive structure. For example, the first interconnection line M1 and the first or second via V1 or V2 may be formed through the same process. The first interconnection line M1 and the first or second via V1 or V2 may be a single conductive structure, which is formed by a dual damascene process. Although not shown, additional metal layers (e.g., M2, M3, M4, and so forth) may be further stacked on the third interlayer insulating layer 130 to form a multi-level interconnect structure.

Figure 2A:
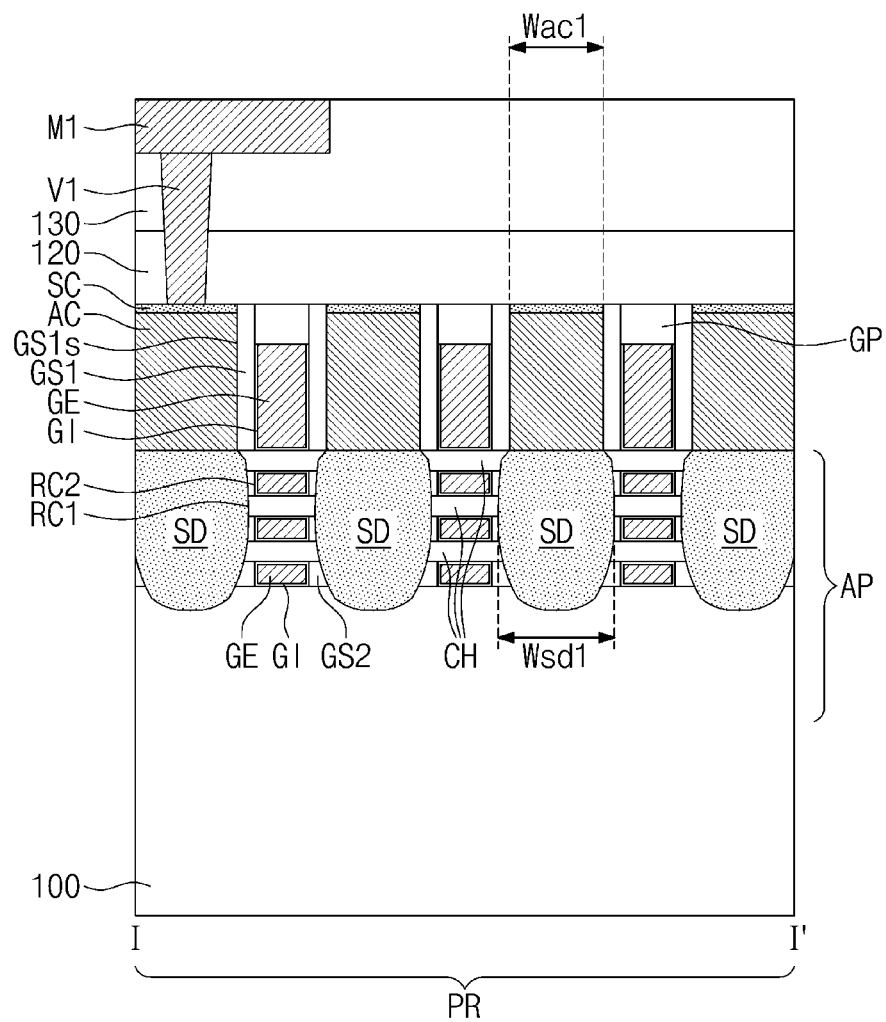
FIGS. 2A and 2B are sectional views, which are respectively taken along the lines I-I' and of FIG. 1A to illustrate a semiconductor device according to an embodiment of the inventive concept.
Figure 2A:
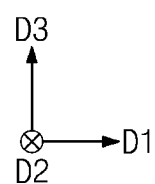
Figure 2B:
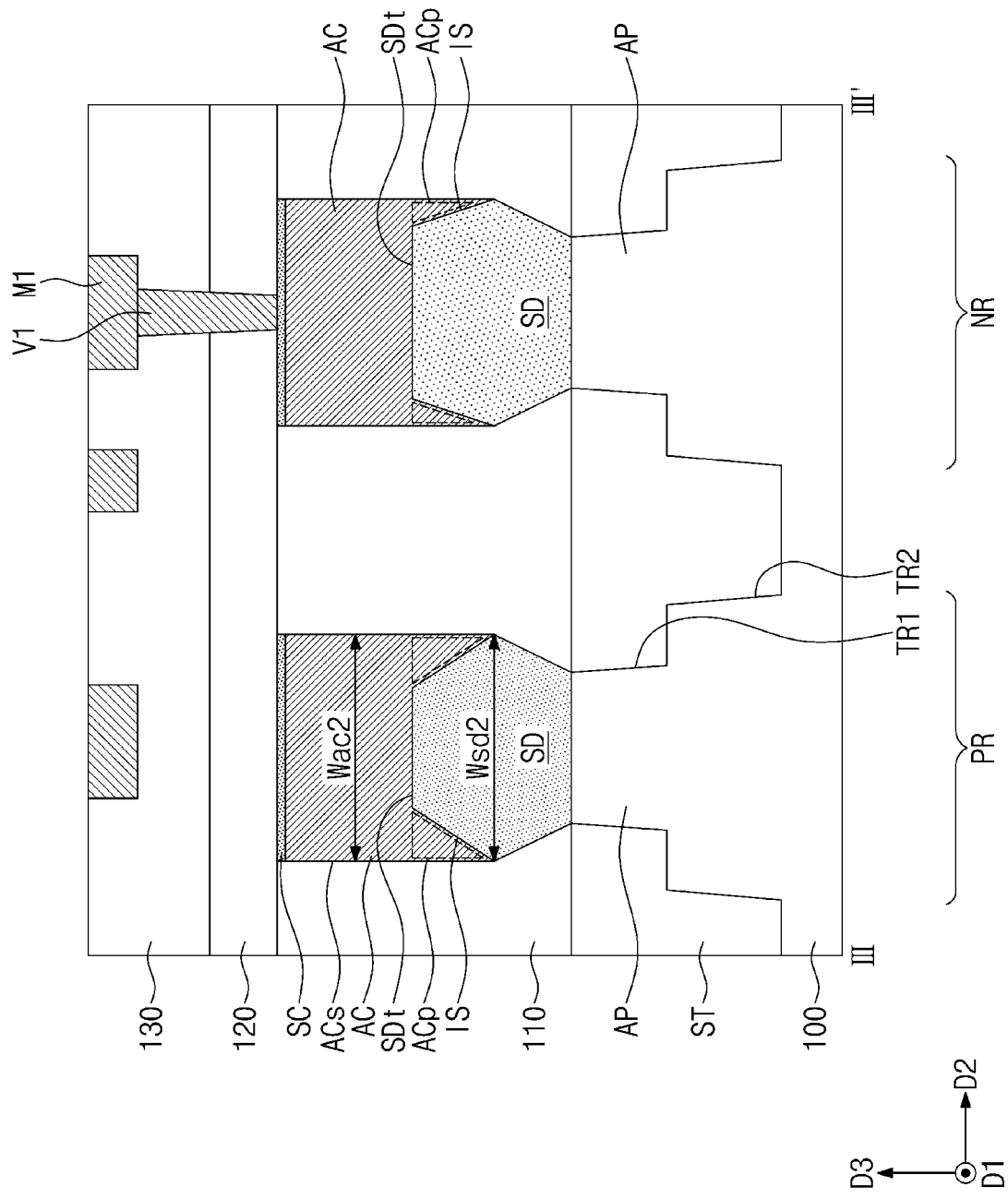

FIGS. 2A and 2B are sectional views, which are respectively taken along the lines I-I' and of FIG. 1A to illustrate a semiconductor device according to an embodiment of the inventive concept. For concise description, a previously-described element may be identified by the same reference number without repeating an overlapping description thereof.

Referring to FIGS. 2A and 2B, the silicide pattern SC may be provided on each of the active contacts AC. Here, each of the active contacts AC may be formed of or may include a highly-doped semiconductor material (e.g., silicon (Si) or germanium (Ge)). The silicide pattern SC may be formed of or may include at least one of metal silicides. The silicide pattern SC may include at least one of, for example, gold (Au), silver (Ag), aluminum (Al), zinc (Zn), titanium (Ti), palladium (Pd), tantalum (Ta), and tungsten (W).

Each of the active contacts AC may be electrically connected to the first via V1 through the silicide pattern SC. A width of the silicide pattern SC in the first direction D1 may be substantially equal to the width Wac1 of each of the active contacts AC in the first direction D1. A width of the silicide pattern SC in the second direction D2 may be substantially equal to the width Wac2 of each of the active contacts AC in the second direction D2. The silicide pattern SC may be spaced apart from each of the source/drain patterns SD in the third direction D3, with each of the active contacts AC interposed therebetween.

Figure 3:
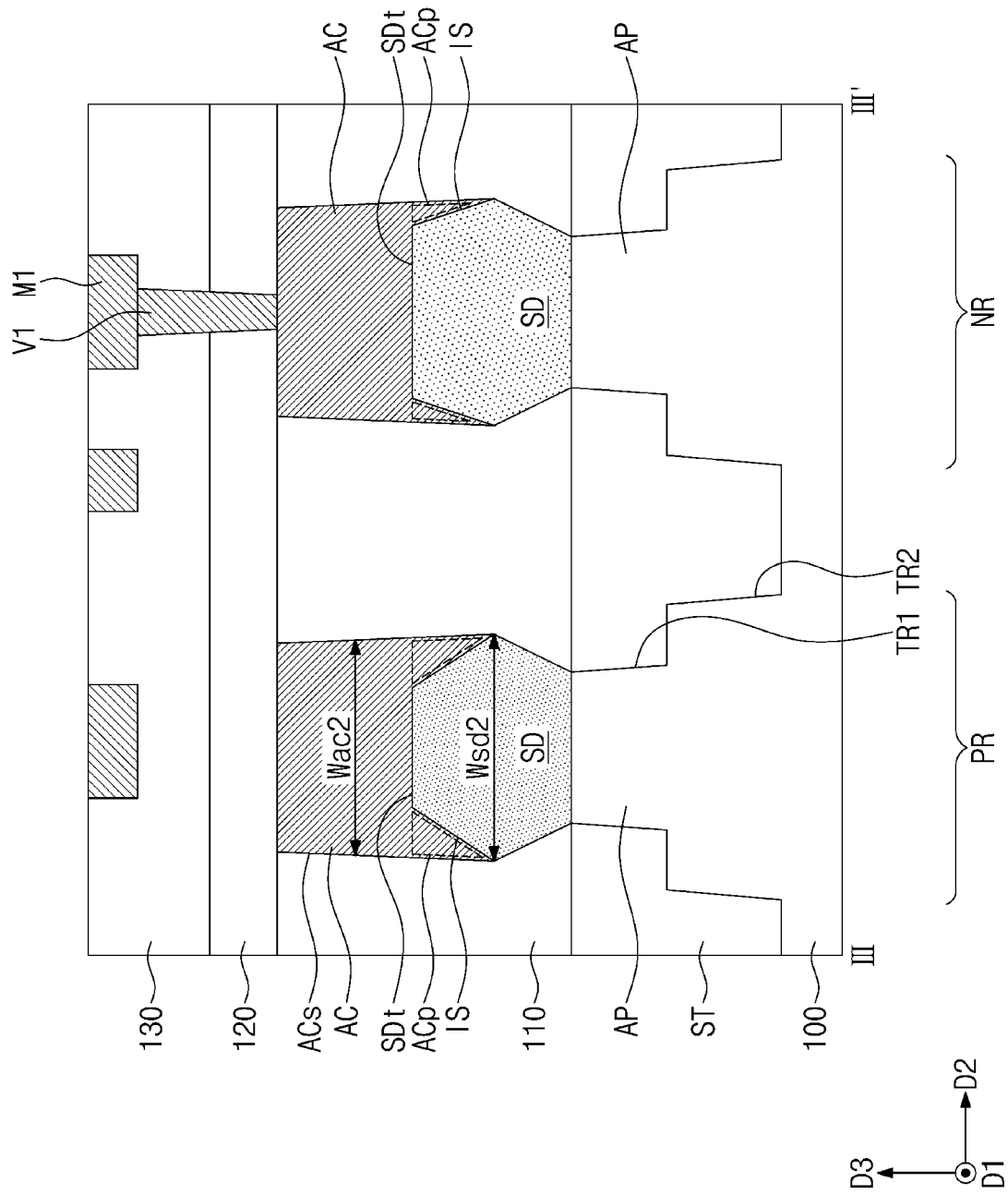
FIGS. 3 and 4 are sectional views, which are respectively taken along the line of FIG. 1A to illustrate a semiconductor device according to an embodiment of the inventive concept.

FIG. 3 is a sectional view, which is taken along the line of FIG. 1A to illustrate a semiconductor device according to an embodiment of the inventive concept. For concise description, a previously-described element may be identified by the same reference number without repeating an overlapping description thereof.

Referring to FIG. 3, the width Wac2 of each of the active contacts AC in the second direction D2 may decrease in the third direction D3. In some embodiments, each of the active contacts AC may have a decreasing width vertically away from the substrate 100. The decreasing width may be measured in the second direction D2. The side surfaces Acs of the active contacts AC may have a slope relative to the third direction D3. In each of the active contacts AC, a mean value of the width Wac2 in the second direction D2 may be smaller than the largest width Wsd2 of each of the source/drain patterns SD in the second direction D2.

Figure 4:
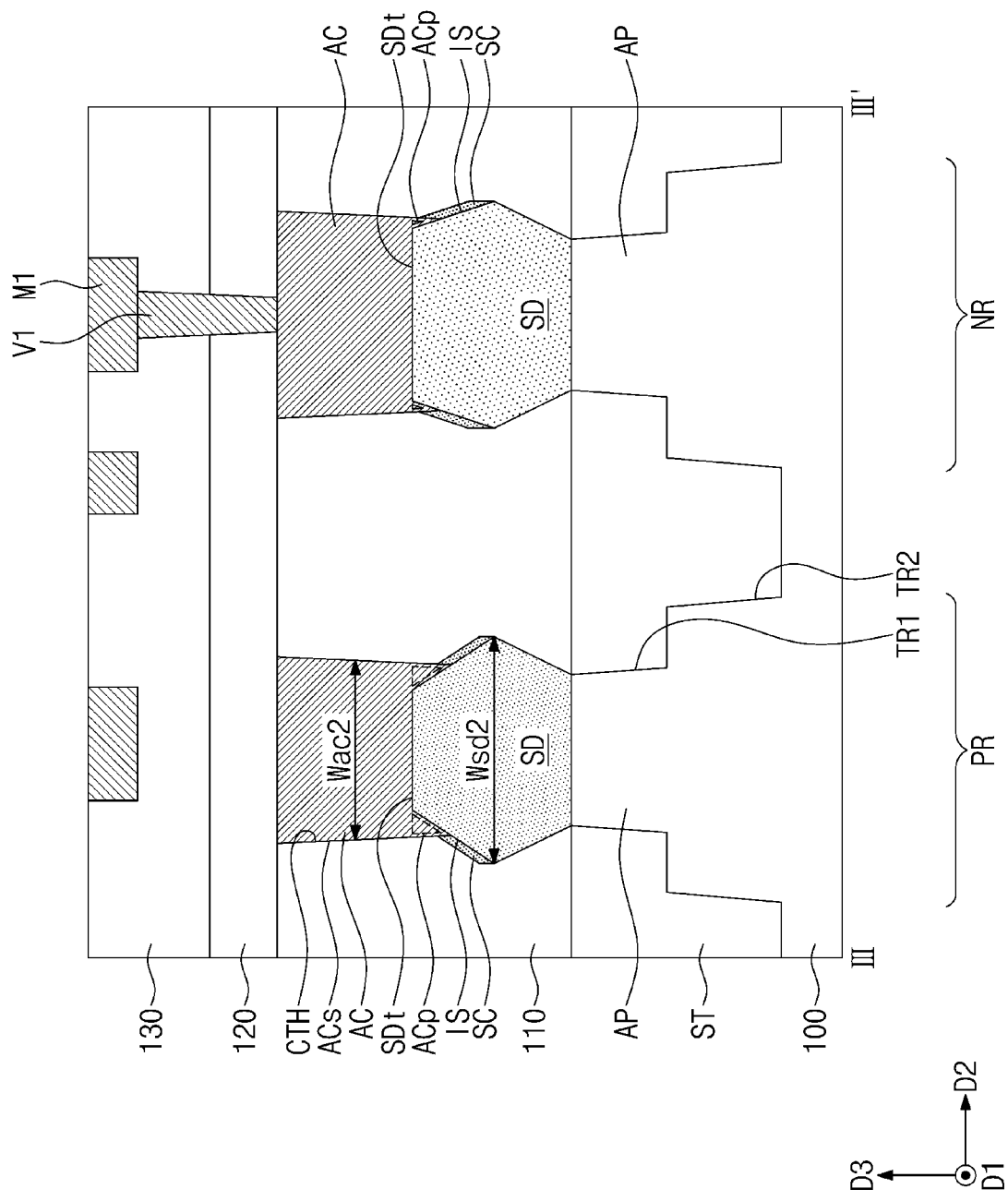

FIG. 4 is a sectional view, which is taken along the line of FIG. 1A to illustrate a semiconductor device according to an embodiment of the inventive concept. For concise description, a previously-described element may be identified by the same reference number without repeating an overlapping description thereof.

Referring to FIG. 4, each of the active contacts AC may partially cover the top surface SDt of each of the source/drain patterns SD. The silicide pattern SC may be provided on a portion of the top surface SDt of the source/drain pattern SD which is not covered with the active contact AC. The silicide pattern SC may cover a portion of the top surface SDt of each of the source/drain patterns SD and may be in contact with a portion of the side surface Acs of each of the active contacts AC.

The width Wac2 of each of the active contacts AC in the second direction D2 may increase in the third direction D3. In some embodiments, each of the active contacts AC may have an increasing width vertically away from the substrate 100. The decreasing width may be measured in the second direction D2. The side surfaces Acs of the active contacts AC may have a slope relative to the third direction D3. However, in each of the active contacts AC, a mean value of the width Wac2 in the second direction D2 may be smaller than the largest width Wsd2 of each of the source/drain patterns SD in the second direction D2. In some embodiments, the mean value of the width Wac2 may be determined using widths of three portions, equally spaced apart from each other and disposed above the top surface SDt, of the active contacts AC.

FIGS. 5A, 6A, 7A, and 13A are plan views illustrating a method of fabricating a semiconductor device, according to an embodiment of the inventive concept. FIGS. 5B, 6B, 7B, 8A, 9A, 10A, 11A, 12A, and 13B are sectional views, each of which is taken along line I-I' of one of FIGS. 5A, 6A, 7A, and 13A to illustrate a method of fabricating a semiconductor device according to an embodiment of the inventive concept. FIGS. 5C, 6C, 12B, and 13C are sectional views, each of which is taken along line II-IF of one of FIGS. 5A, 6A, 7A, and 13A to illustrate a method of fabricating a semiconductor device according to an embodiment of the inventive concept. FIGS. 6D, 7C, 8B, 9B, 10B, 11B, and 12C are sectional views, each of which is taken along line of one of FIGS. 5A, 6A, 7A, and 13A to illustrate a method of fabricating a semiconductor device according to an embodiment of the inventive concept.

Hereinafter, the fabrication method according to an embodiment of the inventive concept will be described in more detail with reference to FIGS. 5A to 13C.

Figure 5A:
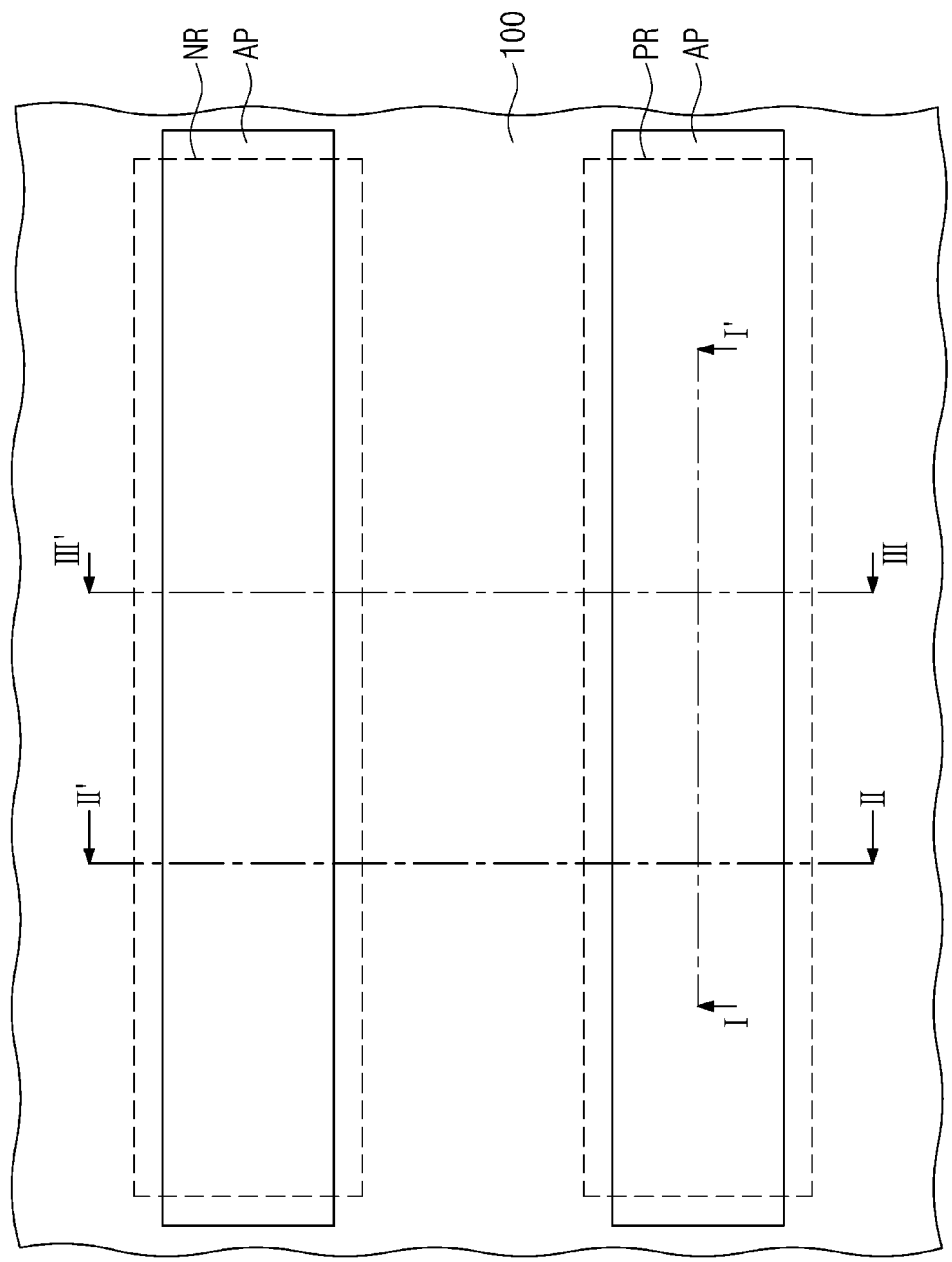
FIGS. 5A, 6A, 7A, and 13A are plan views illustrating a method of fabricating a semiconductor device, according to an embodiment of the inventive concept.
Figure 5B:
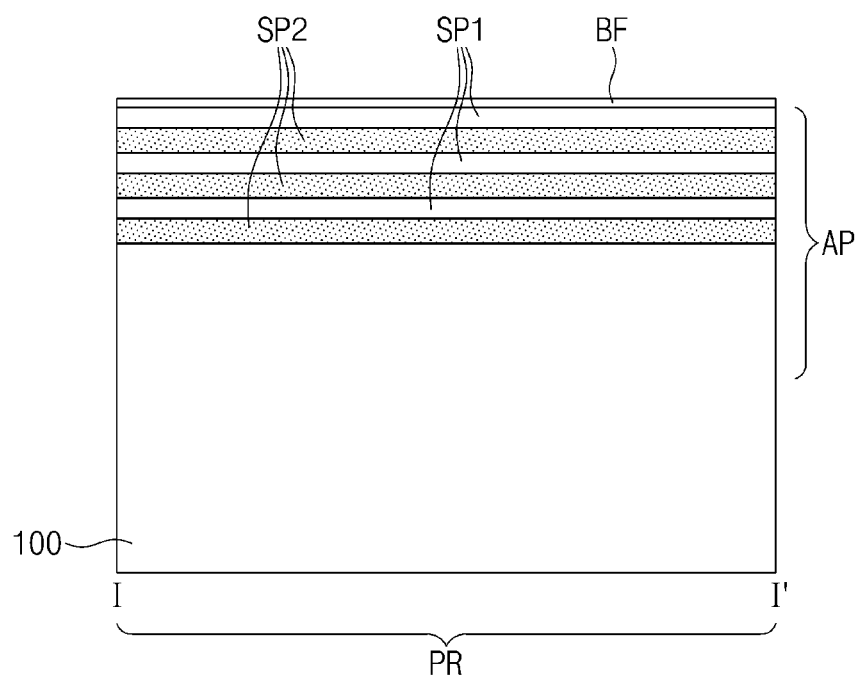
FIGS. 5B, 6B, 7B, 8A, 9A, 10A, 11A, 12A, 13B, 14A, 15A, 16A, and 17A are sectional views, each of which is taken along line I-I' of one of FIGS. 5A, 6A, 7A, and 13A to illustrate a method of fabricating a semiconductor device, according to an embodiment of the inventive concept.
Figure 5C:
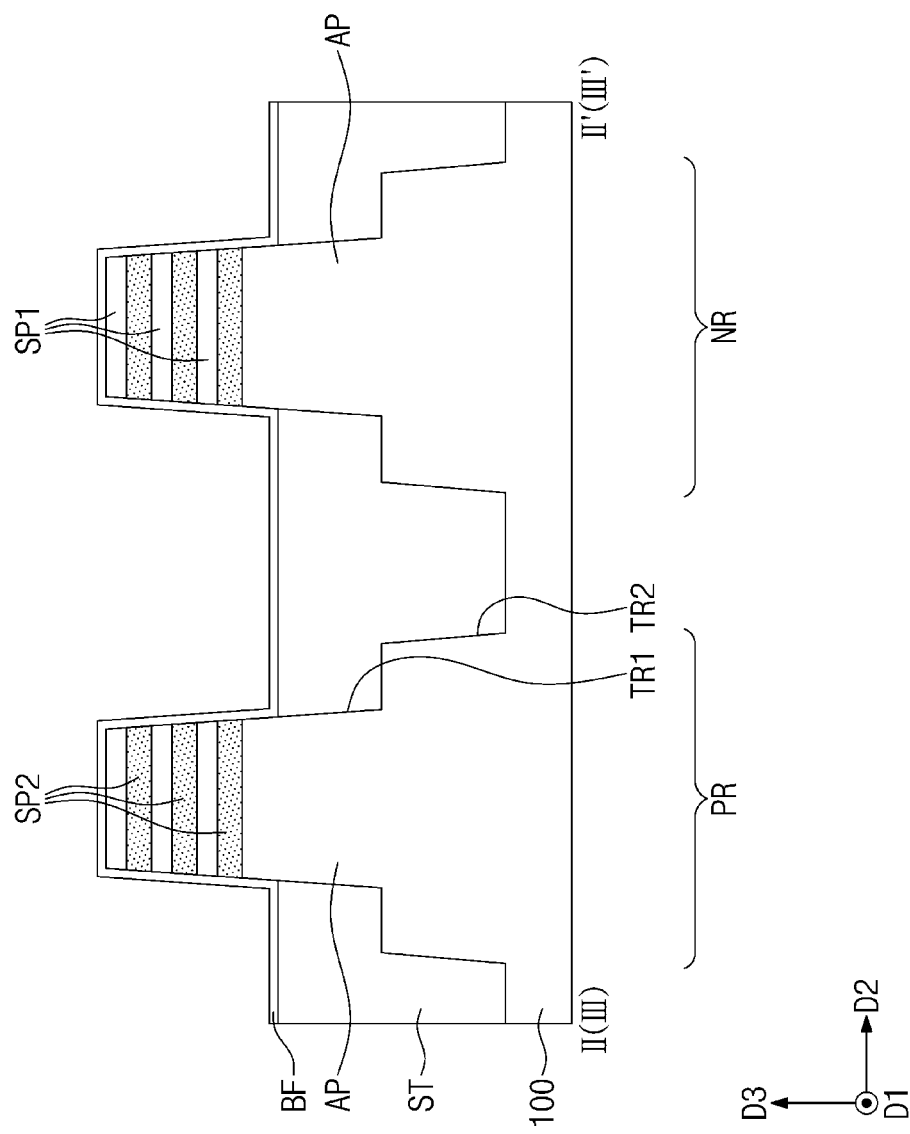

Referring to FIGS. 5A, 5B, and 5C, the substrate 100, which is shaped like a plate that extends in the first and second directions D1 and D2 and is formed of or includes a semiconductor material, may be provided. First semiconductor layers and second semiconductor layers may be alternately and repeatedly formed on the substrate 100. Each of the first and second semiconductor layers may be formed of or may include at least one of silicon (Si), germanium (Ge), and silicon-germanium (SiGe), and in an embodiment, the materials of the first and second semiconductor layers may be different from each other. For example, the first semiconductor layers may be formed of or may include silicon (Si), and the second semiconductor layers may be formed of or may include silicon-germanium (SiGe).

The first trench TR1 defining the active patterns AP may be formed by performing a first patterning process on the substrate 100. During the first patterning process, the first and second semiconductor layers may be patterned to form first semiconductor patterns SP1 and second semiconductor patterns SP2, respectively. The first and second semiconductor patterns SP1 and SP2 may be alternately and repeatedly stacked on each of the active patterns AP.

The second trench TR2 defining the first and second cell regions PR and NR may be formed by performing a second patterning process on the substrate 100. The second trench TR2 may be formed to have a depth that is larger than a depth of the first trench TR1. The active patterns AP may be formed on the first and second cell regions PR and NR, respectively.

The device isolation layer ST may be formed on the substrate 100 to fill the first and second trenches TR1 and TR2. The device isolation layer ST may be formed of or may include at least one of insulating materials (e.g., silicon oxide). The device isolation layer ST may be recessed to expose upper portions of the active patterns AP. As a result, the upper portions of the active patterns AP may protrude above the device isolation layer ST in the third direction D3.

A buffer layer BF may be formed to cover the upper portions of the active patterns AP protruding above the device isolation layer ST. The buffer layer BF may extend to cover the top surface of the device isolation layer ST. The buffer layer BF may be formed of or may include, for example, silicon oxide.

Referring to FIGS. 6A, 6B, 6C and 6D, a sacrificial pattern PP may be formed to cross the active patterns AP. In an embodiment, a plurality of sacrificial patterns PP may be provided. The sacrificial patterns PP may be spaced apart from each other in the first direction D1. Hereinafter, just one sacrificial pattern PP will be described below, for brevity's sake, but the others may also have substantially the same features as those described below. The sacrificial pattern PP may be a line- or bar-shaped pattern extending in the second direction D2.

Figure 6A:
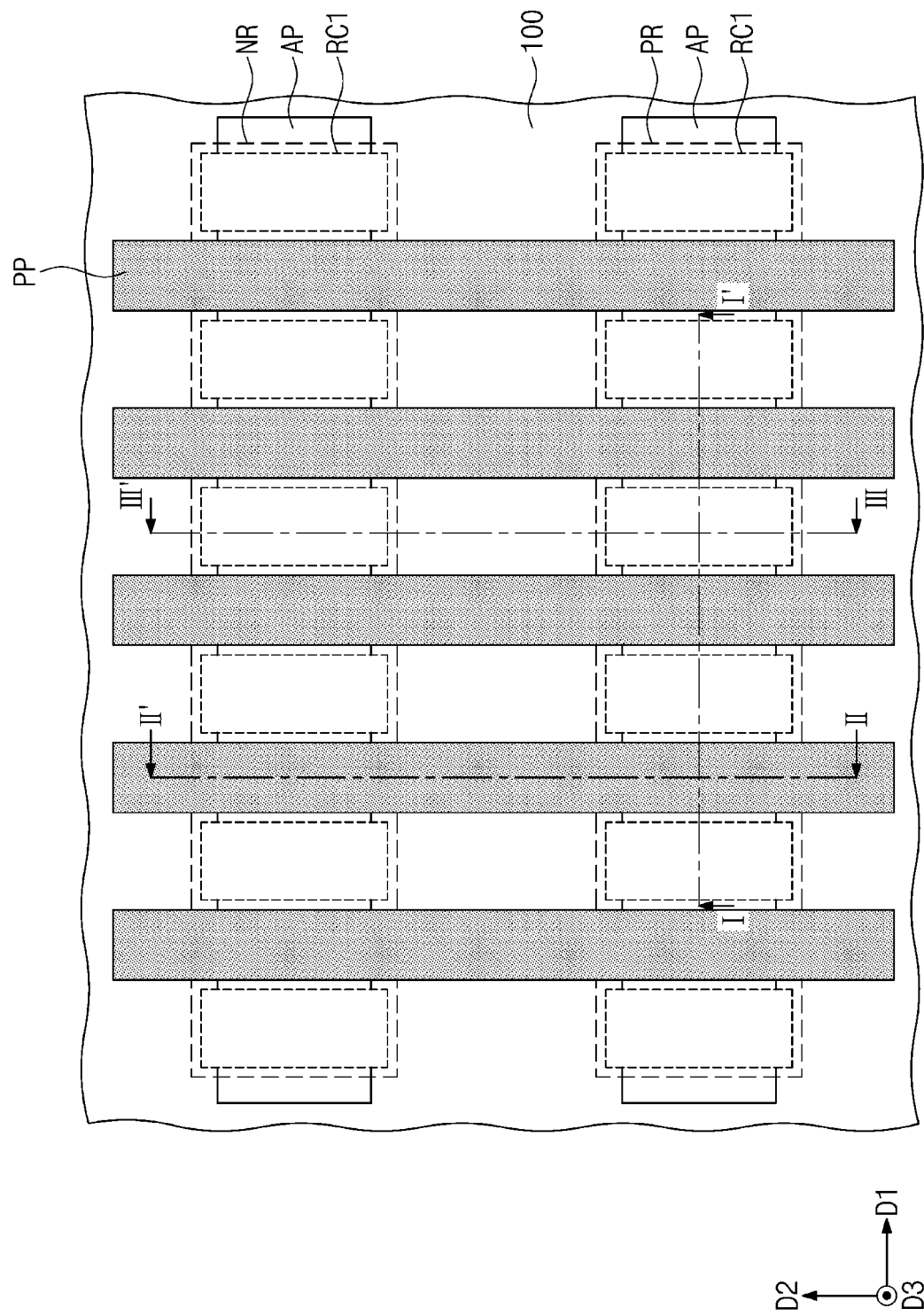
Figure 6B:
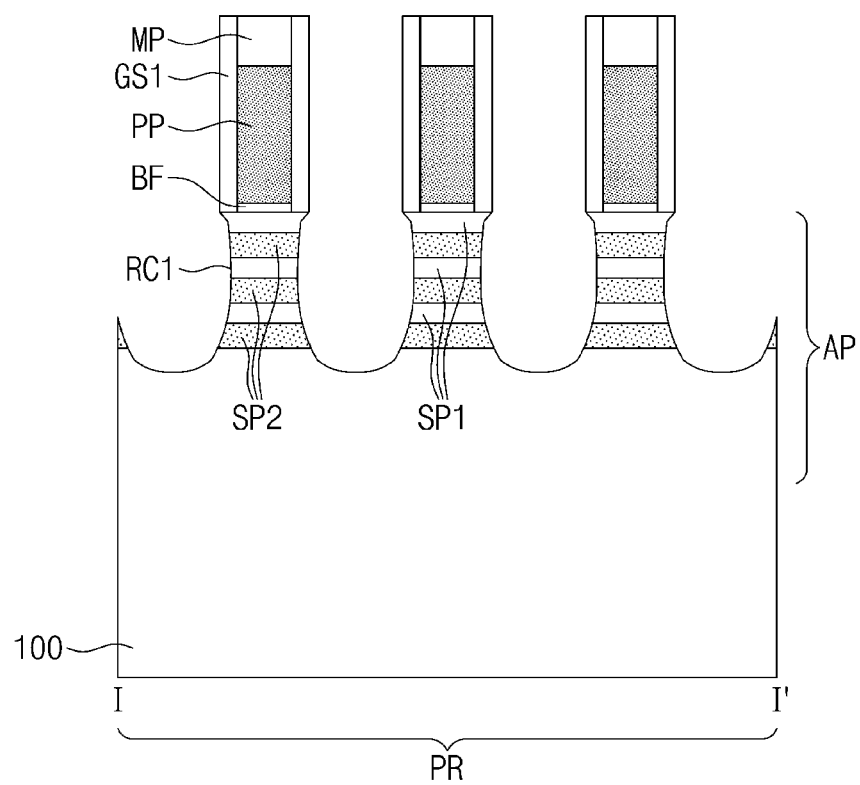
Figure 6B:
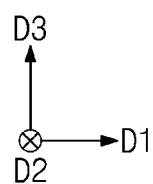
Figure 6D:
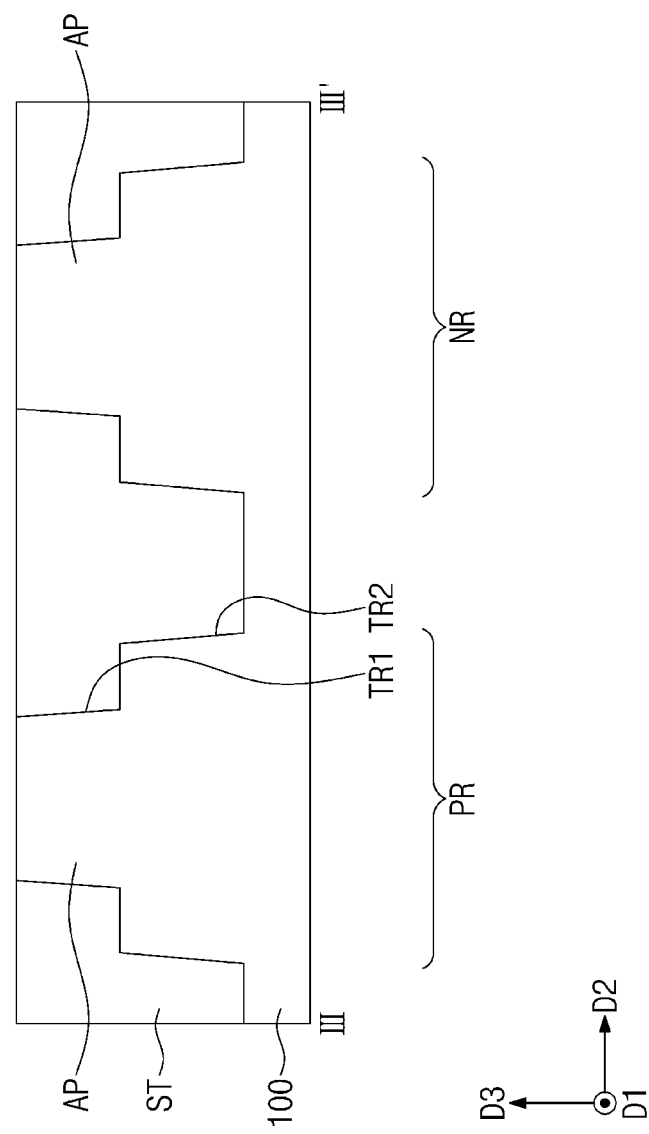

The formation of the sacrificial pattern PP may include forming a sacrificial layer on the substrate 100, forming a hard mask pattern MP on the sacrificial layer, and patterning the sacrificial layer and the buffer layer BF using the hard mask pattern MP as an etch mask. Referring to FIG. 6D, as a result of the patterning of the sacrificial layer and the buffer layer BF, portions of the active patterns AP and a portion of the device isolation layer ST may be exposed to the outside. The sacrificial layer may be formed of or may include, for example, poly silicon. The hard mask pattern MP may be formed of or may include, for example, silicon nitride.

The first gate spacers GS1 may be formed to cover opposite side surfaces of the sacrificial pattern PP. The formation of the first gate spacers GS1 may include forming a first gate spacer layer to cover the top surface of the uppermost one of the first semiconductor patterns SP1, a top surface of the hard mask pattern MP, and side surfaces of the hard mask pattern MP, the sacrificial pattern PP, and the buffer layer BF. The formation of the first gate spacers GS1 may further include removing a portion of the first gate spacer layer covering the top surface of the uppermost one of the first semiconductor patterns SP1 and the top surface of the hard mask pattern MP. The first gate spacers GS1 may be formed of or may include, for example, silicon nitride.

Each of the active patterns AP may be partially recessed to form first recess portions RC1. The first recess portions RC1 may be formed at opposite sides of the sacrificial pattern PP. The first recess portions RC1 may be formed by etching an upper portion of each of the active patterns AP using the hard mask pattern MP and the first gate spacers GS1 as an etch mask.

Figure 7A:
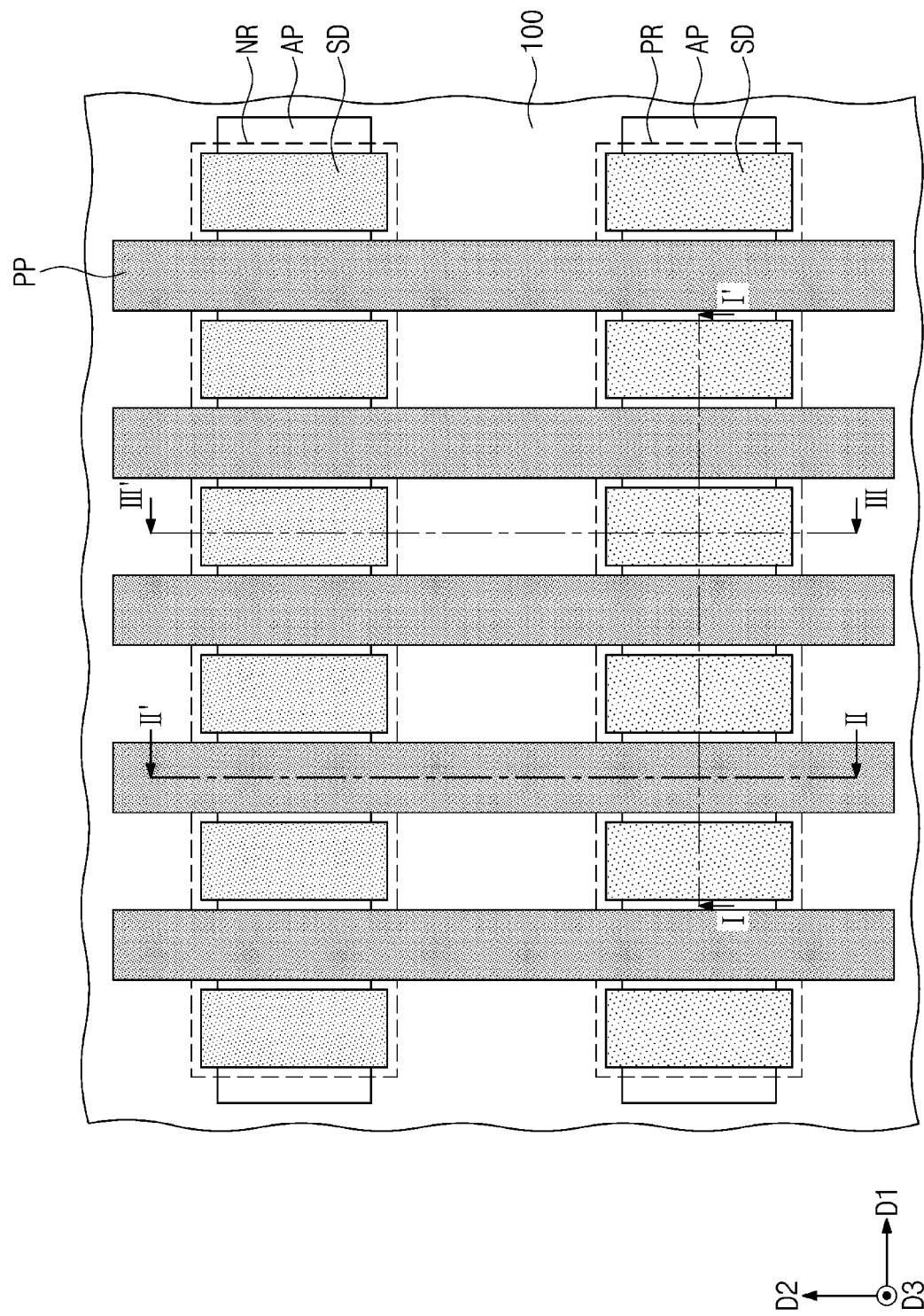
Figure 7B:
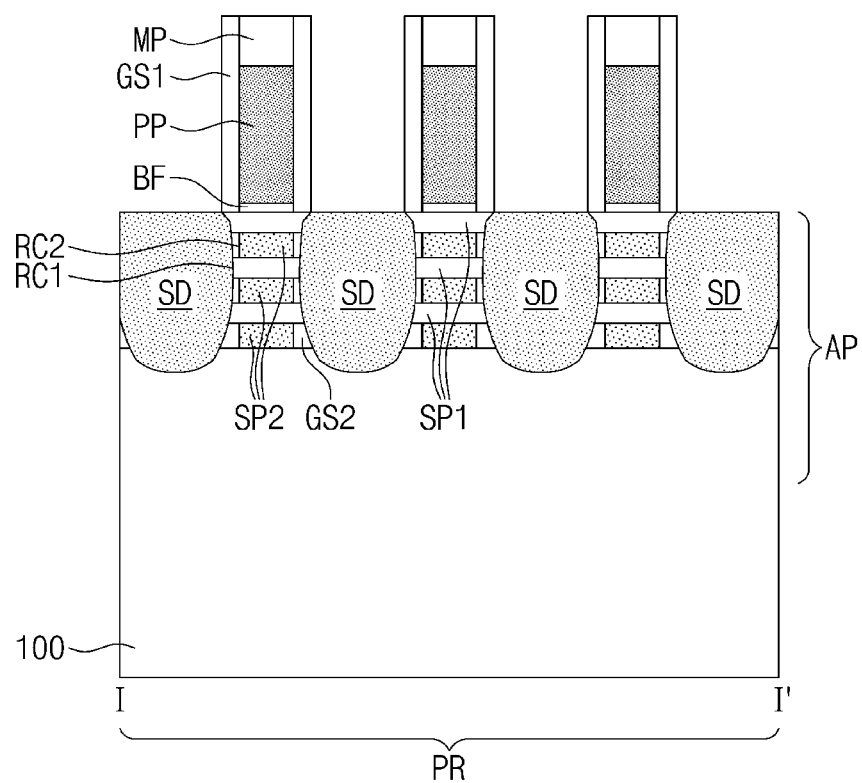
Figure 7B:
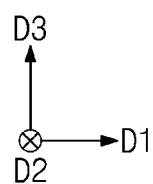
Figure 7C:
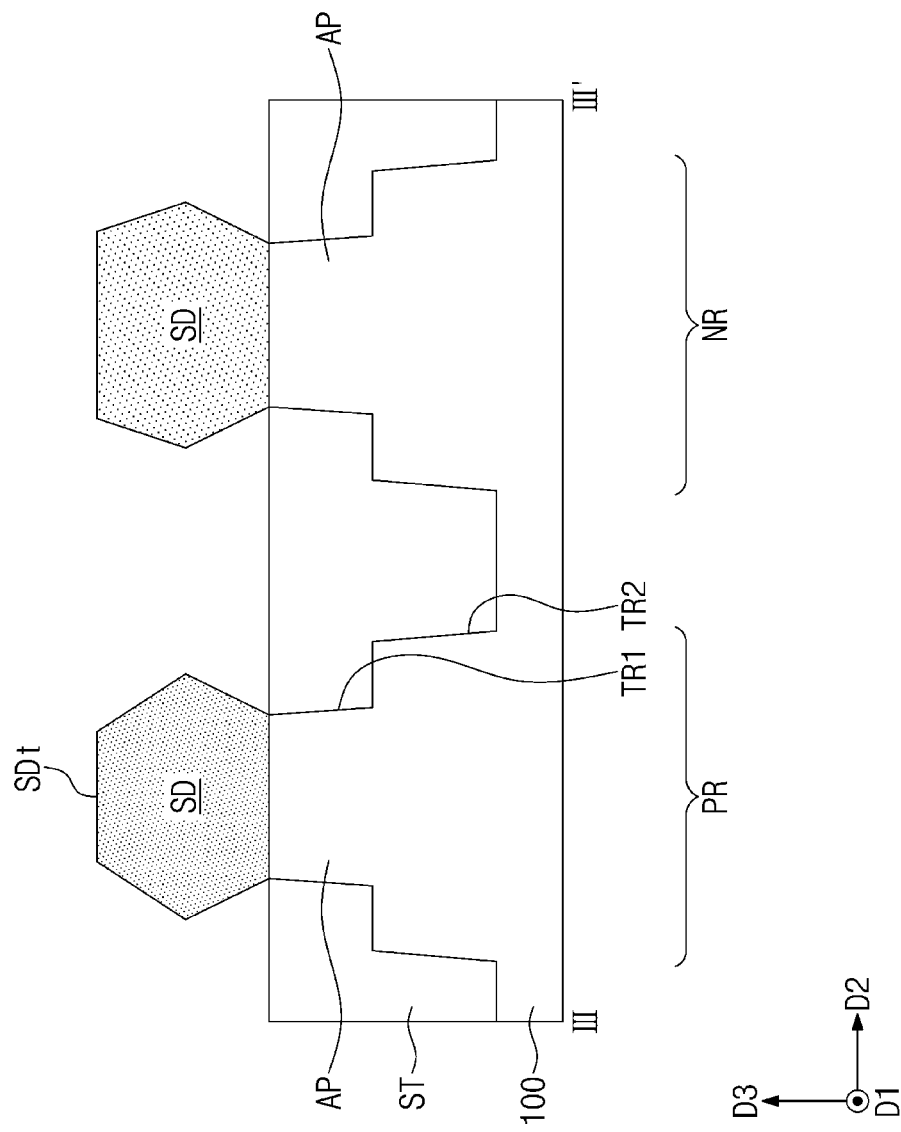

Referring to FIGS. 7A, 7B, and 7C, second recess portions RC2 may be formed by partially recessing the second semiconductor patterns SP2, which are exposed through the first recess portions RC1, in the first direction D1. The first semiconductor patterns SP1, which are exposed through the first recess portions RC1, may not be removed during the formation of the second recess portions RC2. The second gate spacers GS2 may be formed in the second recess portions RC2. The formation of the second gate spacers GS2 may include forming a second gate spacer layer to cover inner side surfaces of the first and second recess portions RC1 and RC2, and removing the second gate spacer layer from the first recess portions RC1. The second gate spacers GS2 may be formed of or may include, for example, silicon nitride. The present invention is not limited thereto. In an embodiment, the second recess portions RC2 and the second gate spacers GS2 may not be formed.

The source/drain patterns SD may be formed to fill the first recess portions RC1, which are formed in the upper portions of the active patterns AP. A pair of the source/drain patterns SD may be formed at opposite sides of the sacrificial pattern PP.

The source/drain patterns SD may be formed by a selective epitaxial growth process using the top surfaces of the active patterns AP and the first semiconductor patterns SP1, which are exposed by the first recess portions RC1, as a seed layer. In an embodiment, impurities may be injected into the source/drain patterns SD during the selective epitaxial growth process or in an in-situ manner. In an embodiment, the impurities may be injected into the source/drain patterns SD through a separate doping process, after the formation of the source/drain patterns SD. Referring to FIG. 7C, the top surfaces SDt of the source/drain patterns SD may be located at a level, which is higher than the top surface of the device isolation layer ST and the top surfaces of the active patterns AP, and may be exposed to the outside.

Figure 8A:
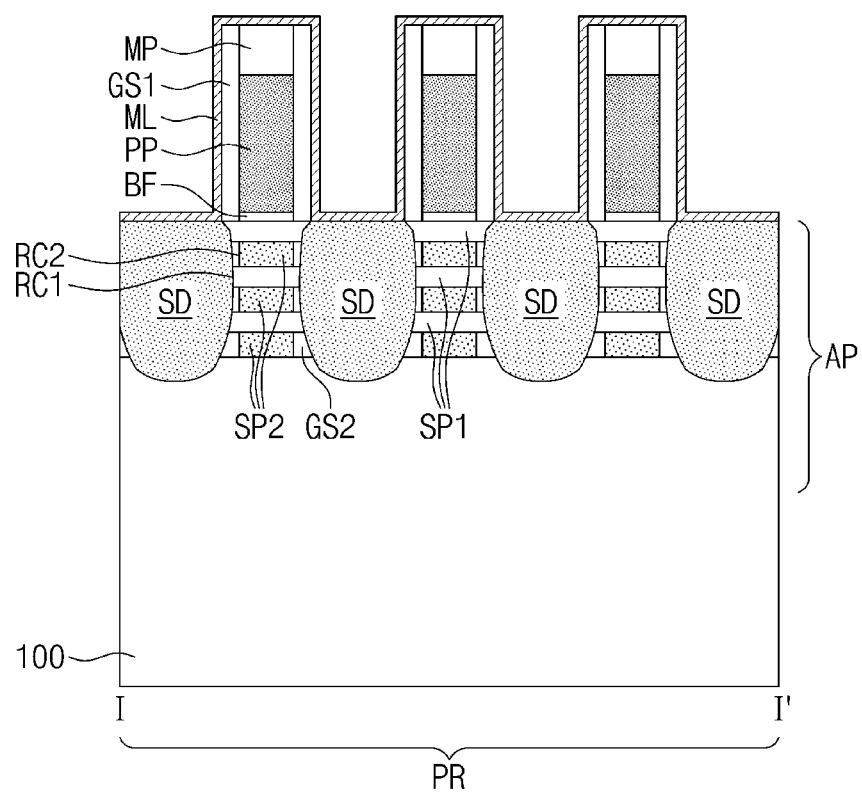
Figure 8B:
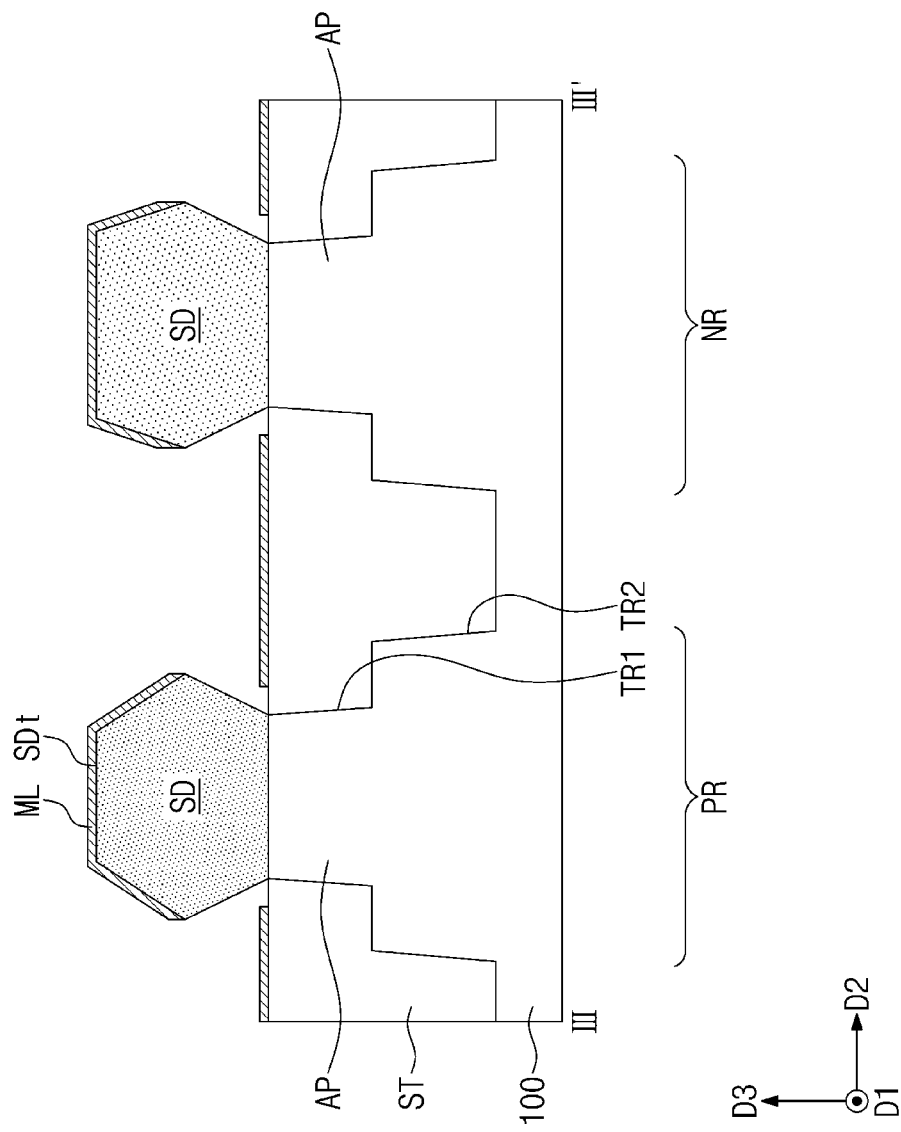

Referring to FIGS. 8A and 8B, a metal layer ML may be formed to conformally cover the top surfaces SDt of the source/drain patterns SD, the side surfaces of the first gate spacers GS1, and the top surface of the hard mask pattern MP. The metal layer ML may cover a portion of the top surface of the device isolation layer ST. The metal layer ML may be formed of or may include at least one of, for example, gold (Au), silver (Ag), aluminum (Al), zinc (Zn), titanium (Ti), palladium (Pd), tantalum (Ta), and tungsten (W).

Figure 9A:
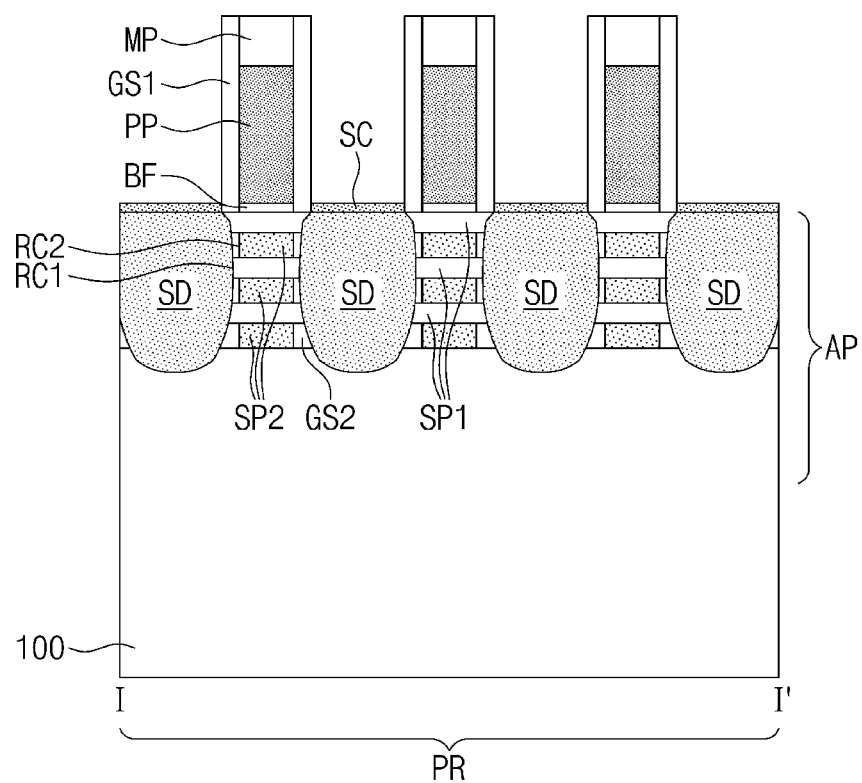
Figure 9A:
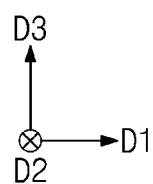
Figure 9B:
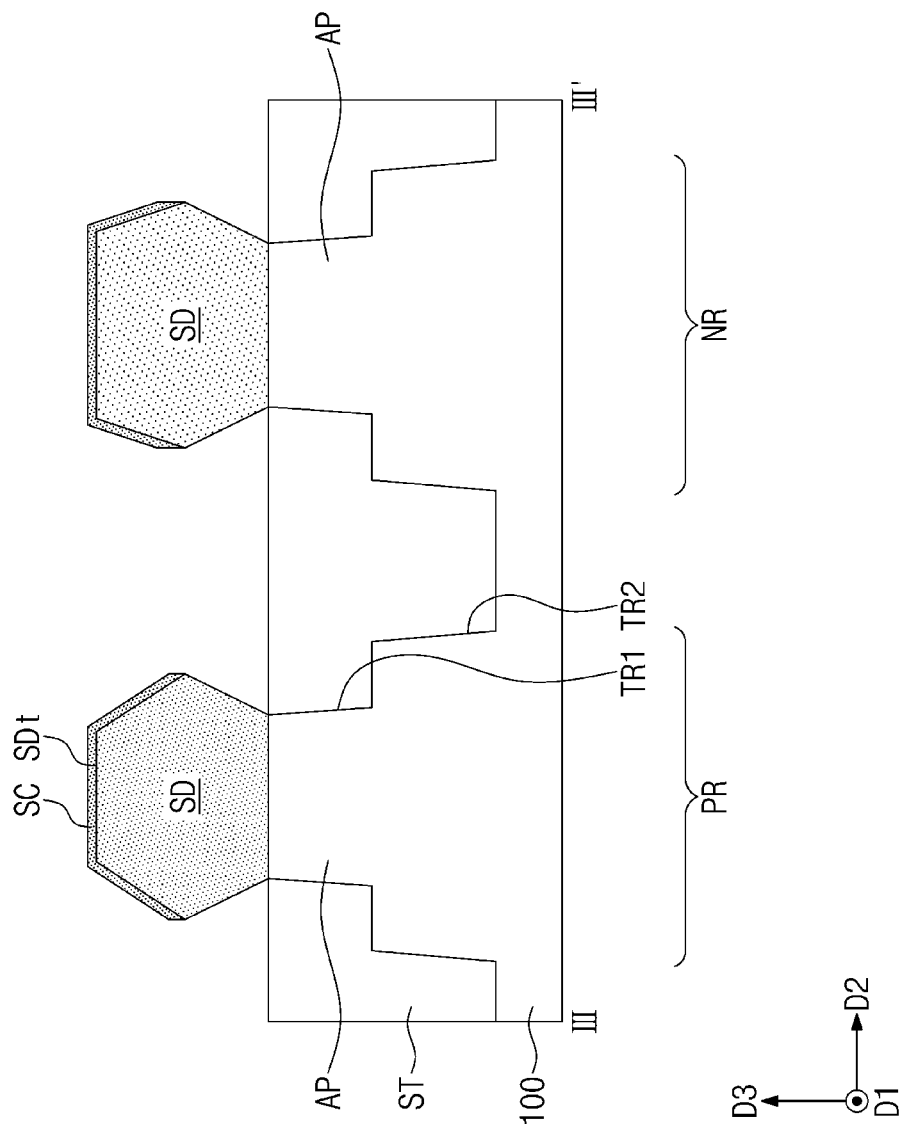

Referring to FIGS. 9A and 9B in conjunction with FIGS. 8A and 8B, a selective silicidation process may be performed on the metal layer ML, which is formed on the top surfaces SDt of the source/drain patterns SD. The selective silicidation process may selectively form the silicide patterns SC on the top surfaces SDt of the source/drain patterns SD. Thereafter, a strip process may be performed to remove an un-reacted portion of the metal layer ML, which does not react the source/drain patterns to form silicide in the silicidation process. In some embodiments, the silicide patterns SC may be formed on the top surfaces SDt of the source/drain patterns using the selective silicidation process in a self-aligned manner in which no photolithography is involved to form the silicide patterns SC.

The silicide patterns SC may contain a metallic element and a semiconductor element (e.g., silicon (Si) and germanium (Ge)). In the silicide patterns SC, the metallic and semiconductor elements may have composition ratios that allow the metallic and semiconductor elements to have a eutectic point. In some embodiments, the silicide patterns SC may include or may be formed of a material layer of a mixture of the metallic element and the semiconductor element or an alloy thereof. The composition ratios of the metallic element and the semiconductor element may be a composition which renders the material layer to be a eutectic alloy or mixture. For example, in the silicide patterns SC, an atomic percent of the metallic element may range from about 5 at. % to about 25 at. %, and an atomic percent of the semiconductor element (e.g., silicon (Si) and germanium (Ge)) may range from about 70 at. % to about 95 at. %. The eutectic composition has the effect of lowering the process temperature in forming the silicide pattern, thereby lowering the thermal budget and increasing the reaction rate.

In an embodiment, the silicide patterns SC may contain or may be formed of gold (Au) and silicon (Si), and for a eutectic alloy of gold and silicon, the atomic percent of gold (Au) may be about 19 at. % (±5 at. %) and the atomic percent of silicon (Si) may be about 81 at. % (±10 at. %). In an embodiment, the silicide patterns SC may contain or may be formed of silver (Ag) and silicon (Si), and for a eutectic alloy of silver and silicon, the atomic percent of silver (Ag) may be about 12 at. % (±5 at. %) and the atomic percent of silicon (Si) may be about 88 at. % (±10 at. %). In an embodiment, the silicide patterns SC may contain or may be formed of aluminum (Al) and silicon (Si), and for a eutectic alloy of aluminum and silicon, the atomic percent of aluminum (Al) may be about 11 at. % (±5 at. %) and the atomic percent of silicon (Si) may be about 89 at. % (±10 at. %).

Figure 10A:
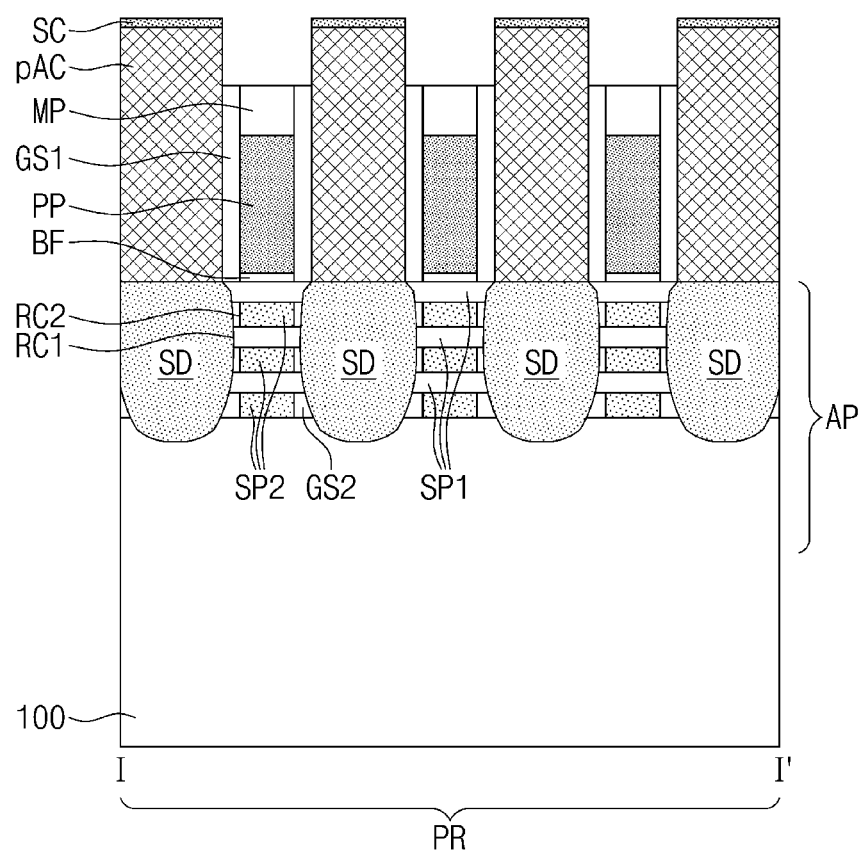
Figure 10A:
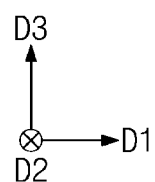
Figure 10B:
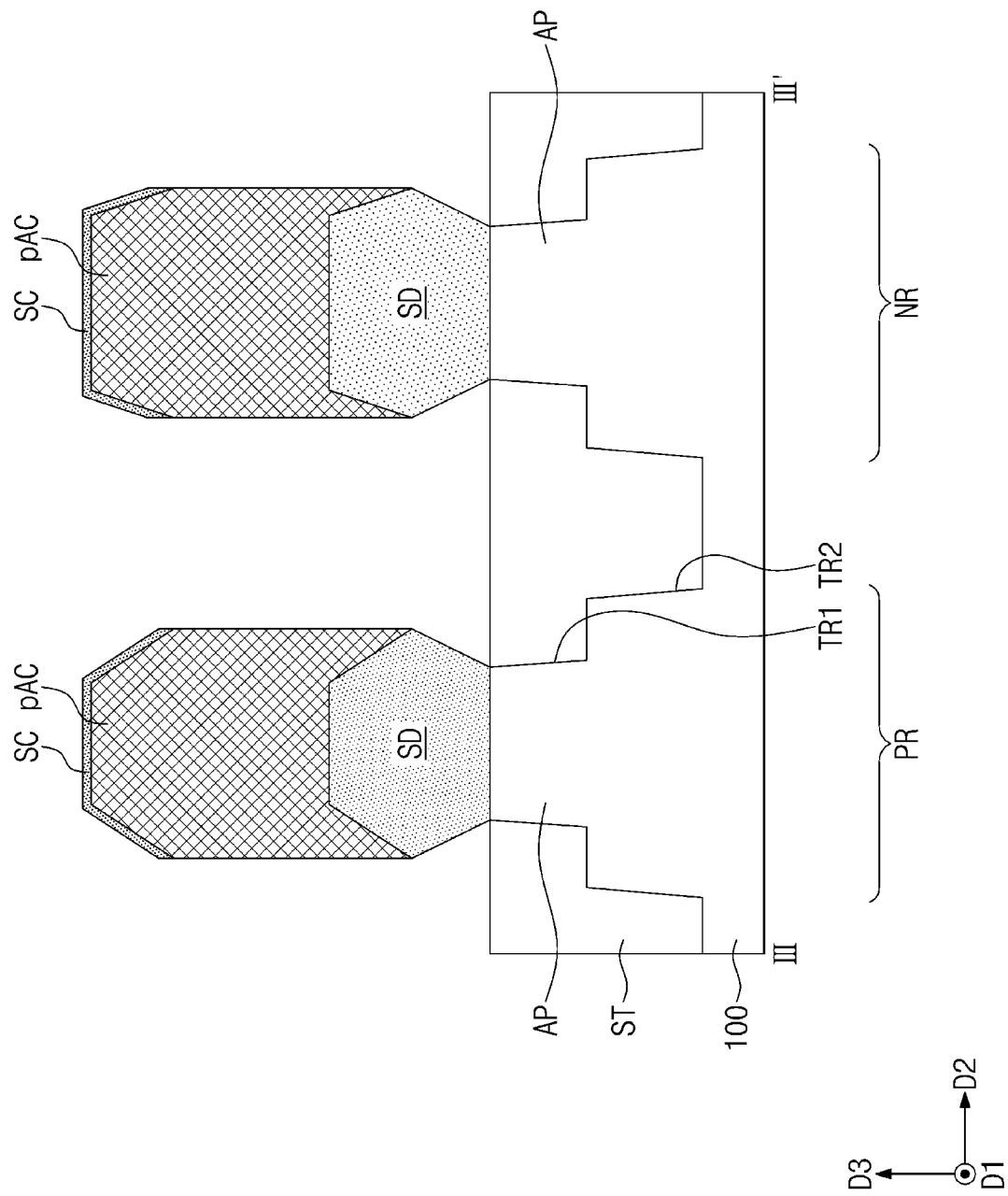

Referring to FIGS. 10A and 10B, preliminary active contacts pAC may be formed between the source/drain patterns SD and the silicide patterns SC. The preliminary active contacts pAC may be formed by a metal-induced crystallization process based on the silicide patterns SC. The preliminary active contacts pAC may be formed to have top surfaces that are located at a level higher than the top surface of the hard mask pattern MP and the top surfaces of the first gate spacers GS1.

In an embodiment, the preliminary active contacts pAC may be formed by supplying a deposition gas and an etching gas at the same time. In an embodiment, the preliminary active contacts pAC may be formed by alternately and repeatedly performing steps of supplying the deposition gas and supplying the etching gas. As a result of the supplying of the deposition gas, a semiconductor layer may be deposited between the source/drain patterns SD and the silicide patterns SC, and as a result of the supplying of the etching gas, the silicon or germanium layer, which is formed on the top surface of the hard mask pattern MP, the top surfaces of the first gate spacers GS1, and the top surface of the device isolation layer ST, may be removed. The semiconductor layer may include or may be formed of silicon or germanium. The deposition gas may contain silicon (Si) or germanium (Ge). The deposition gas may include, for example, $GeH_4$, $Ge_2H_6$, $SiH_4$, $SiCl_2H_2$, $SiCl_3H$, $SiClH_3$, $SiCl_4$, $Si_2H_6$, $Si_3H_8$, or $Si_4H_{10}$. The etching gas may contain chlorine (Cl). The etching gas may include, for example, HCl, $Cl_2$, $BCL_3$, or $GeCl_4$. In some embodiments, the semiconductor layer may be in amorphous state.

Figure 11A:
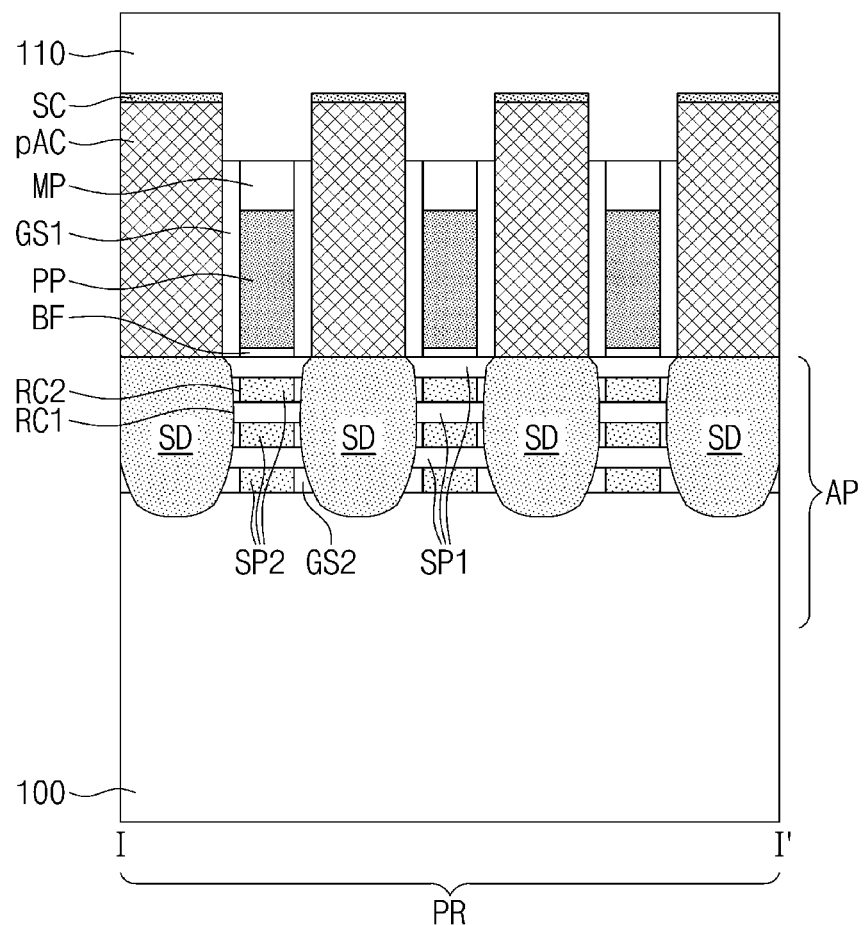

Referring to FIGS. 11A and 11B, the first interlayer insulating layer 110 may be formed to cover top surfaces of the silicide patterns SC and side surfaces of the preliminary active contacts pAC. The first interlayer insulating layer 110 may cover the top surface of the gate capping pattern GP, the top surfaces of the first gate spacers GS1, and the top surface of the device isolation layer ST.

Figure 12A:
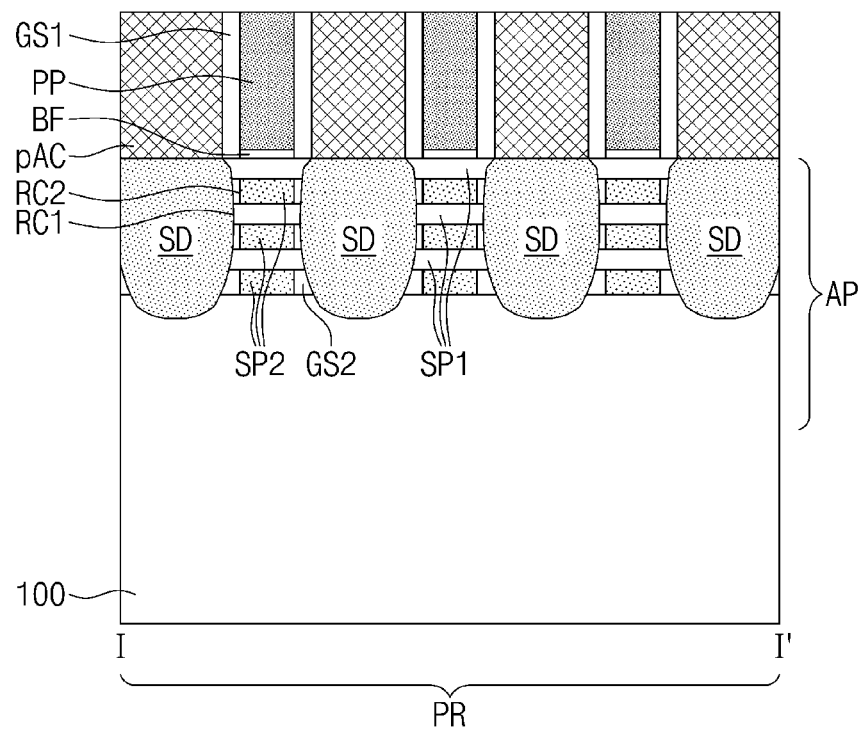
Figure 12B:
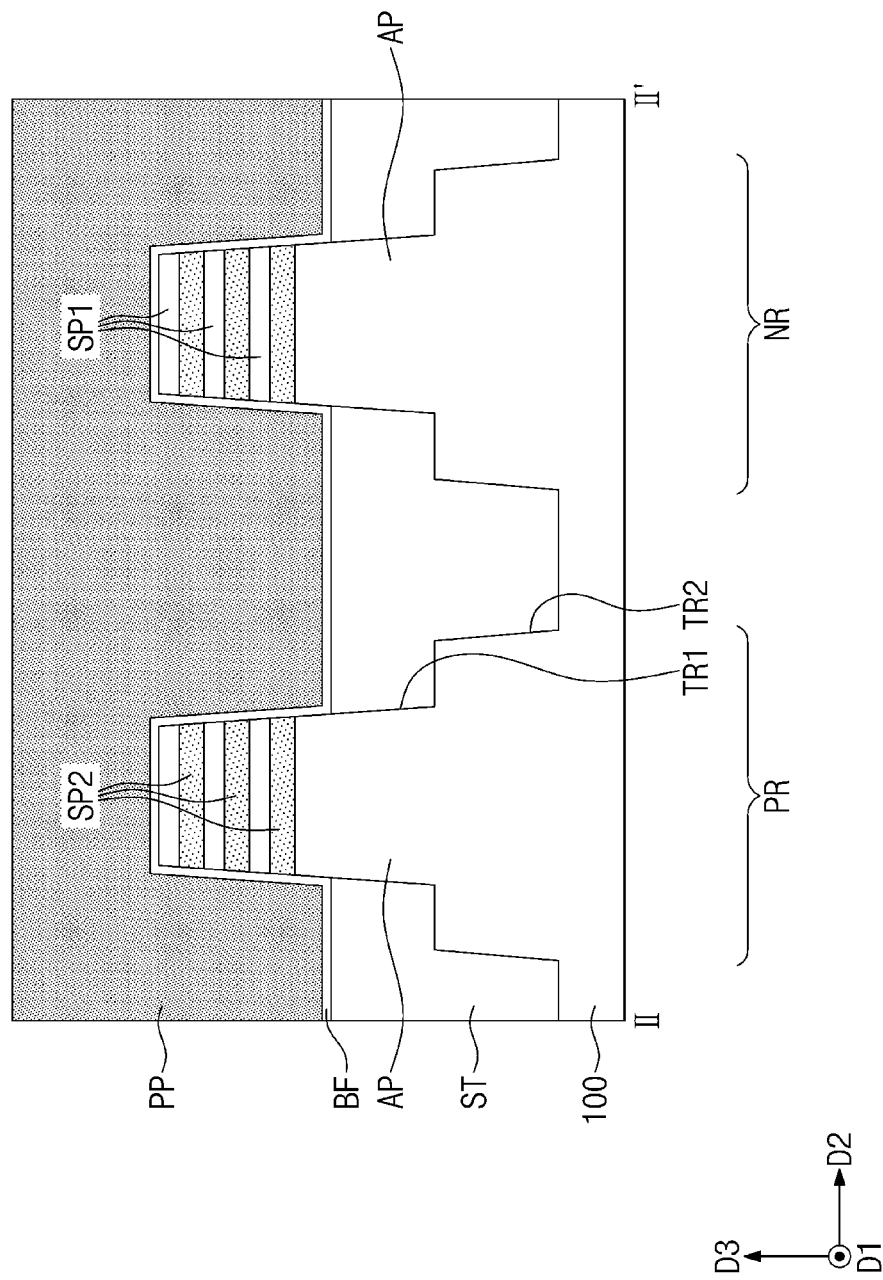
Figure 12C:
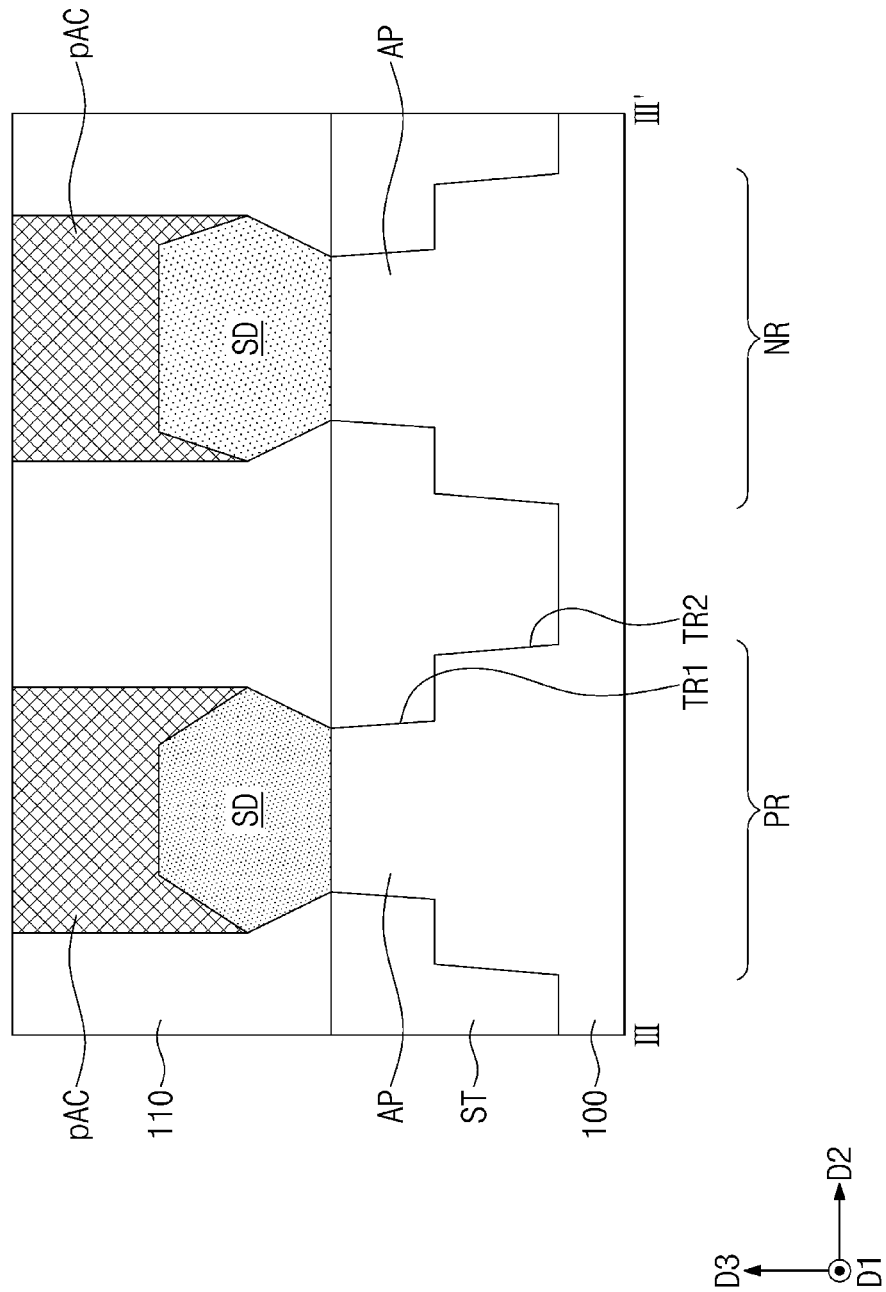

Referring to FIGS. 12A, 12B, and 12C with FIGS. 11A and 11B, a planarization process may be performed to expose a top surface of the sacrificial pattern PP. In an embodiment, the planarization process may be performed to remove a portion of the first interlayer insulating layer 110, a portion of each of the preliminary active contacts pAC, the silicide patterns SC, and the hard mask pattern MP, which are located at a level higher than the top surface of the sacrificial pattern PP. For example, the planarization process may be an etch-back process or a chemical mechanical polishing (CMP) process. After the planarization process, the top surface of the first interlayer insulating layer 110 may be substantially coplanar with the top surfaces of the preliminary active contacts pAC and may be located at substantially the same level as the top surfaces of the first gate spacers GS1 and the top surface of the sacrificial pattern PP.

Figure 13A:
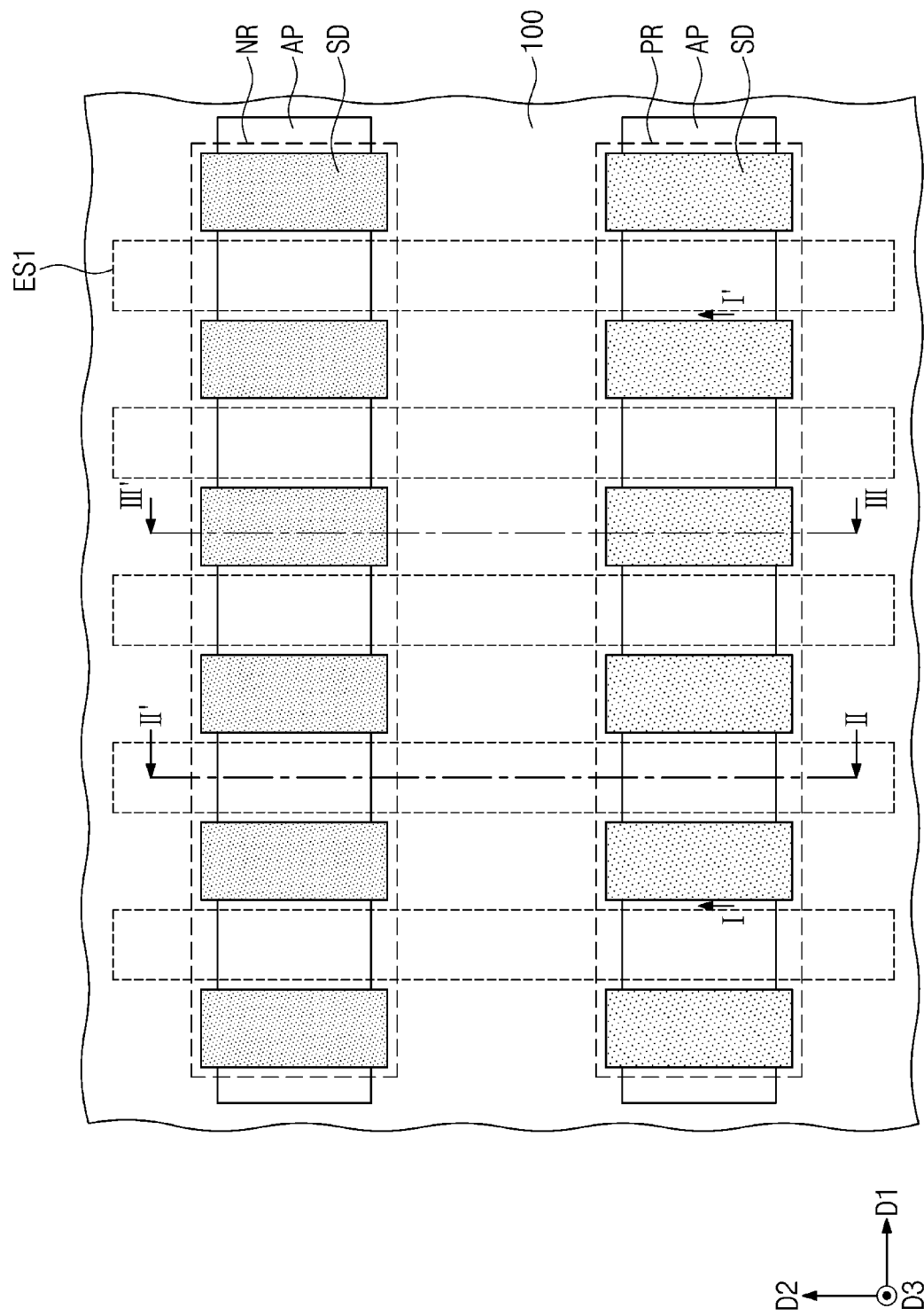
Figure 13B:
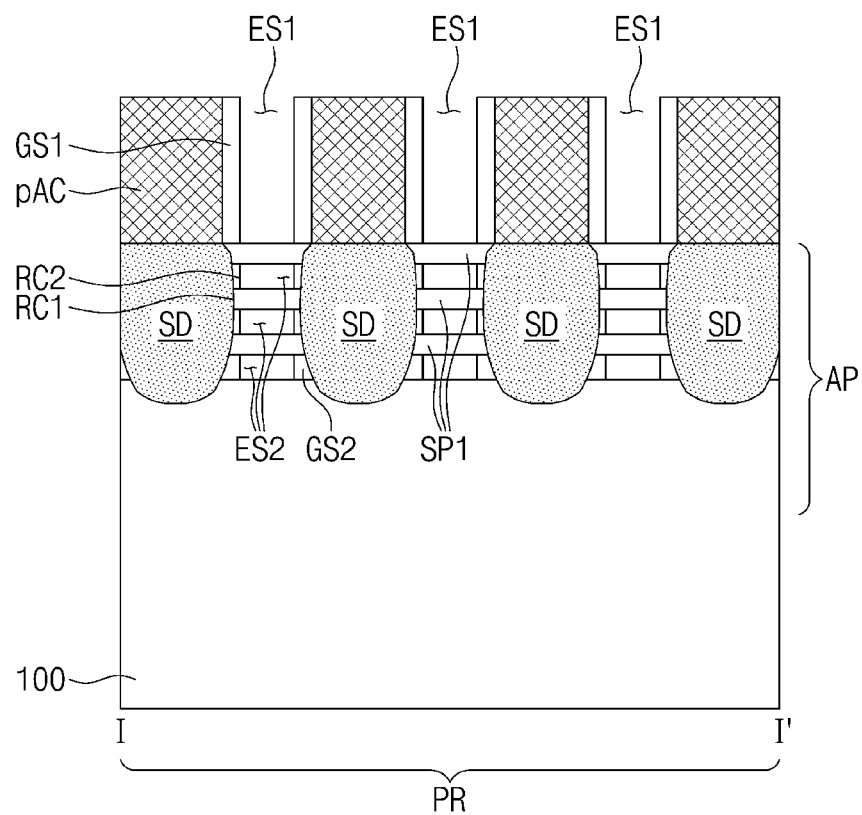
Figure 13B:
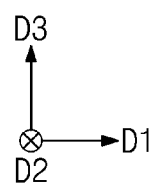
Figure 13C:
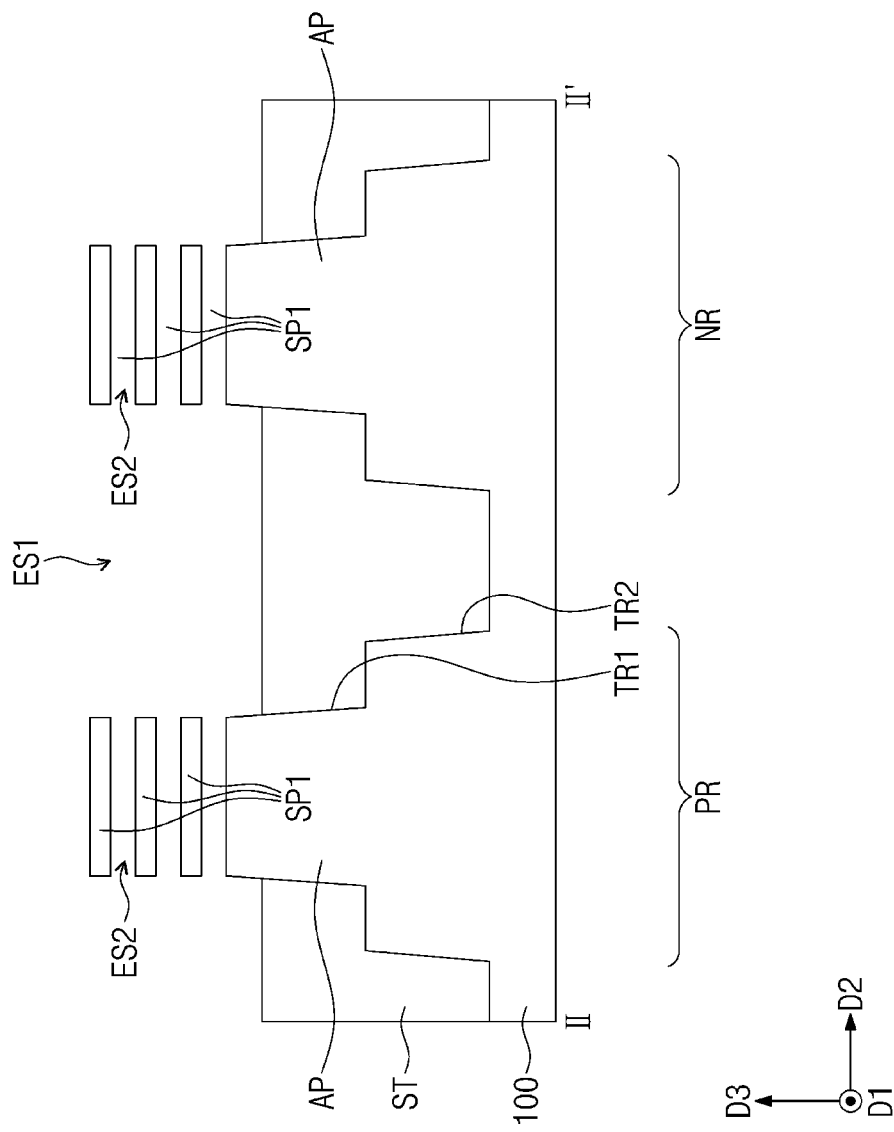

Referring to FIGS. 13A, 13B, and 13C with FIGS. 12A, 12B, and 12C, the sacrificial pattern PP may be selectively removed. As a result of the removal of the sacrificial pattern PP, a first empty space ES1, which exposes a portion of each of the active patterns AP, the uppermost one of the first semiconductor patterns SP1, and inner side surfaces of the first gate spacers GS1, may be formed.

Thereafter, the second semiconductor patterns SP2 may be selectively removed. In some embodiments, the second semiconductor patterns SP2 may be exposed through the first empty space ES1. The second semiconductor patterns SP2 may be selectively removed using an etching process, in which an etch rate of the second semiconductor patterns SP2 is higher than an etch rate of the first semiconductor patterns SP1. The first semiconductor patterns SP1 may not be removed by the etching process and may be left after the etching process. The first and second gate spacers GS1 and GS2 may not be removed in the etching process of the second semiconductor patterns SP2. As a result of the removal of the second semiconductor patterns SP2, second empty spaces ES2 may be formed. Each of the second empty spaces ES2 may be defined as a space between the first semiconductor patterns SP1, which are adjacent to each other in the third direction D3.

Referring to FIGS. 1A, 1B, 1C, and 1D with FIGS. 13A, 13B, and 13C, the gate electrode GE may be formed to fill the first and second empty spaces ES1 and ES2. Before the formation of the gate electrode GE, the gate insulating pattern GI may be formed to conformally cover top, bottom, and side surfaces of the first and second empty spaces ES1 and ES2. The first semiconductor patterns SP1 may be referred to as the channel layers CH.

Next, the gate capping pattern GP may be formed on the gate electrode GE. The formation of the gate capping pattern GP may include partially recessing the gate electrode GE filling the first empty space ES1, forming a capping layer to fill a space formed by recessing the gate electrode GE, and performing a planarization process to remove a portion of the capping layer. The gate capping pattern GP may be formed of or may include, for example, silicon nitride. The top surface of the gate capping pattern GP may be substantially coplanar with the top surfaces of the first gate spacers GS1.

Thereafter, the active contacts AC may be formed at opposite sides of the gate electrode GE. The preliminary active contacts pAC may be replaced with the active contacts AC. In an embodiment, the formation of the active contacts AC may include selectively removing the preliminary active contacts pAC and filling a space, which is formed by removing the preliminary active contacts pAC, with a metallic material. In an embodiment, the active contacts AC may be formed by performing a silicidation process on the preliminary active contacts pAC. In an embodiment, the active contacts AC may be formed by injecting impurities of high concentration into the preliminary active contacts pAC.

The second interlayer insulating layer 120 may be formed to cover the top surface of the first interlayer insulating layer 110, the top surfaces of the active contacts AC, and the top surface of the gate capping pattern GP. The gate contact GC may be formed to penetrate the second interlayer insulating layer 120 and the gate capping pattern GP and to be electrically connected to the gate electrode GE.

The third interlayer insulating layer 130 may be formed on the top surface of the second interlayer insulating layer 120 and the top surface of the gate contact GC. A first metal layer may be formed in the third interlayer insulating layer 130, and in an embodiment, the first metal layer may include the first interconnection lines M1, the first via V1, and the second via V2. The first via V1 may extend from an inner region of the third interlayer insulating layer 130 into the second interlayer insulating layer 120 and may be connected to the top surface of each of the active contacts AC. In an embodiment, additional metal layers (e.g., M2, M3, M4, and so forth) may be further stacked on the third interlayer insulating layer 130 to form a multi-level interconnection, for example.

Figure 14A:
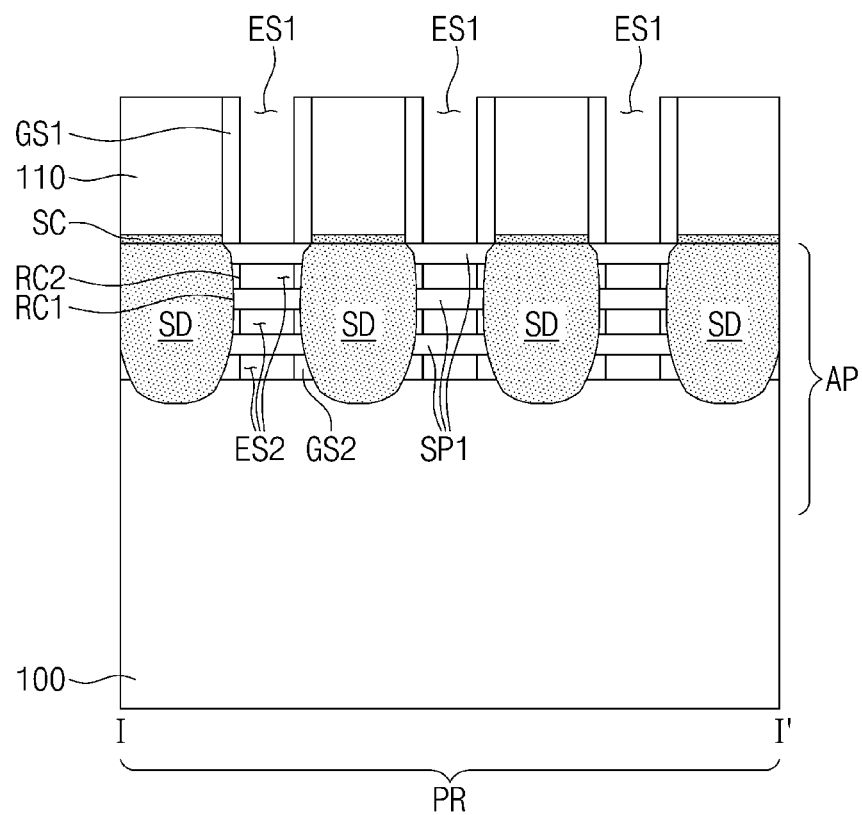
Figure 14A:
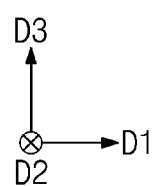
Figure 14B:
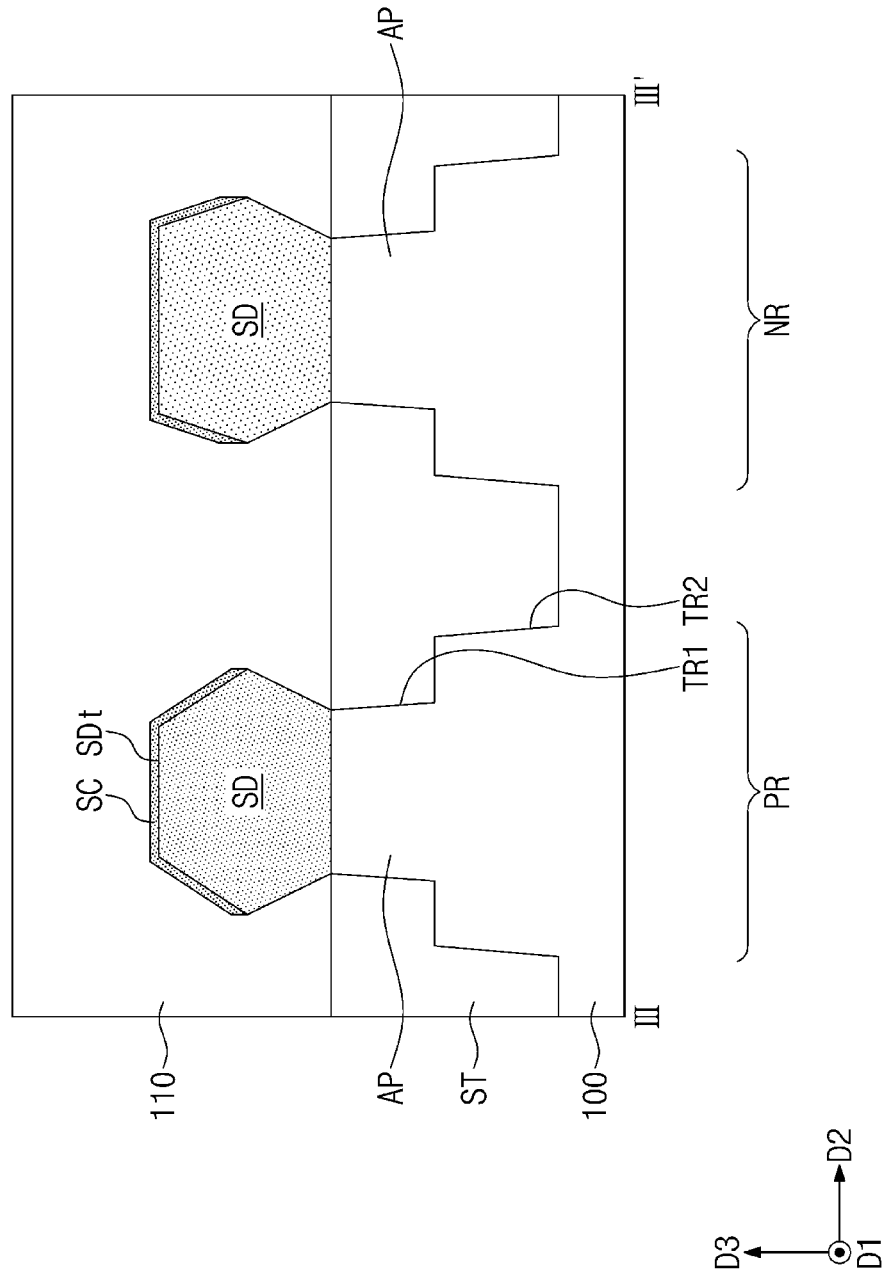
Figure 15A:
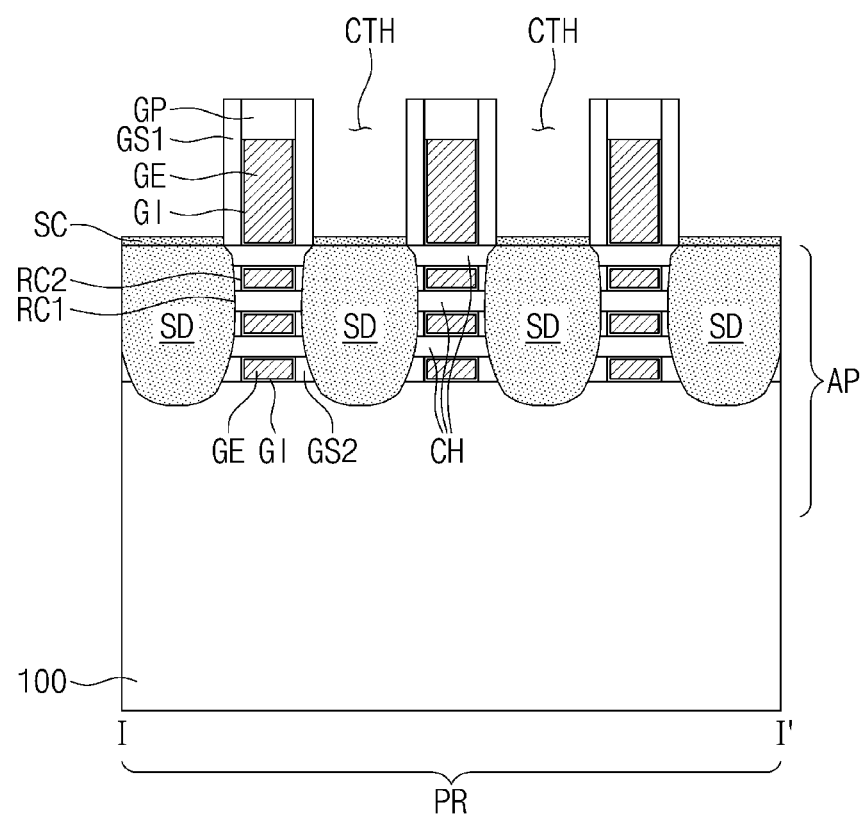
Figure 15A:
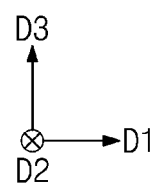
Figure 15B:
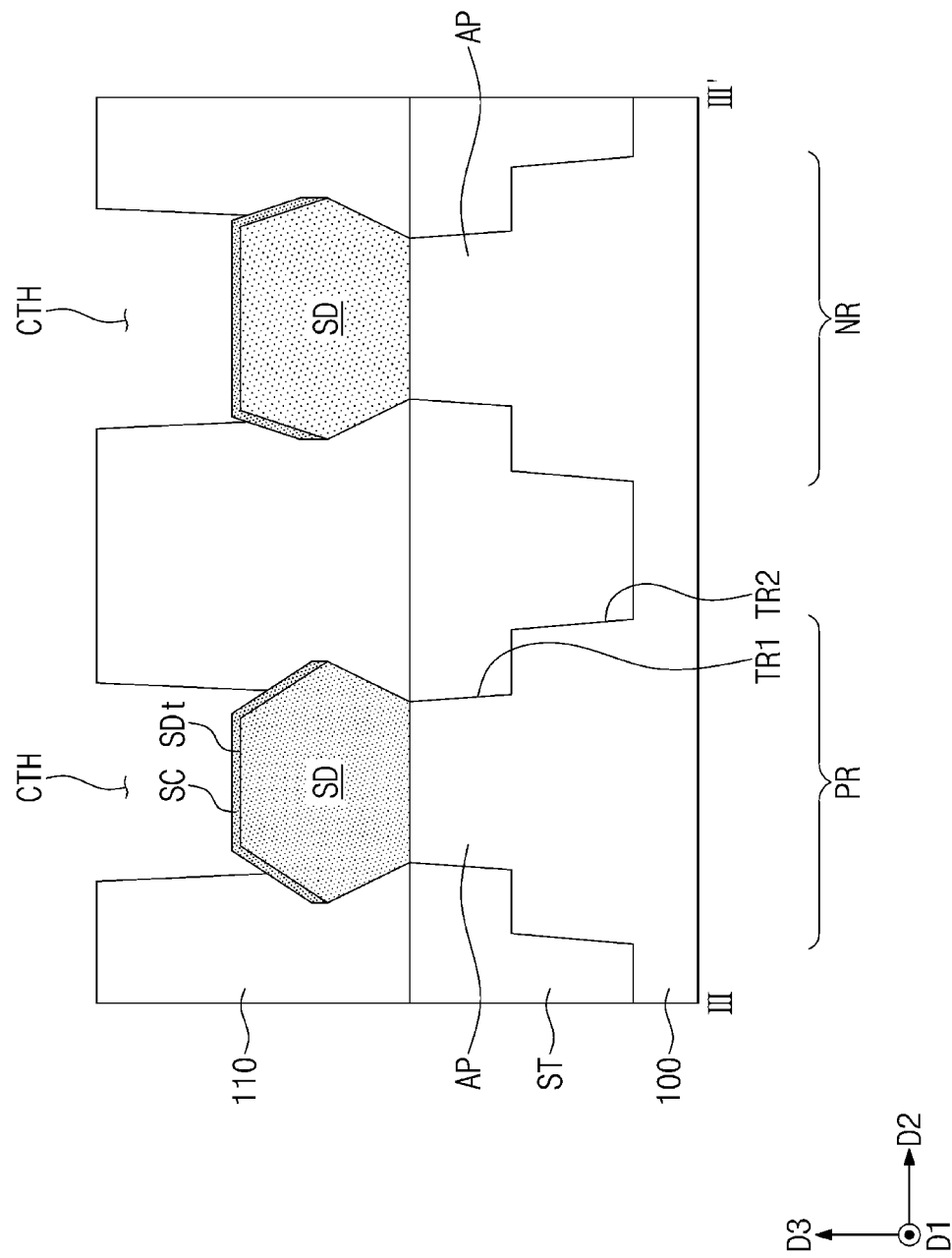

FIGS. 14A and 15A are sectional views, which are respectively taken along the line I-I' of FIG. 13A to illustrate a method of fabricating a semiconductor device according to an embodiment of the inventive concept. FIGS. 14B and 15B are sectional views, which are respectively taken along the line of FIG. 13A to illustrate a method of fabricating a semiconductor device according to an embodiment of the inventive concept. For convenience in description, a description of the steps corresponding to FIGS. 5A to 9B will be omitted, and the steps corresponding to FIGS. 9A and 9B and subsequent steps will be described in more detail below.

Referring to FIGS. 14A and 14B with FIGS. 9A and 9B, the first interlayer insulating layer 110 may be formed to cover the top surfaces of the silicide patterns SC. The first interlayer insulating layer 110 may cover the top surface of the gate capping pattern GP, the top surfaces of the first gate spacers GS1, and the top surface of the device isolation layer ST.

Next, a planarization process may be performed to expose the top surface of the sacrificial pattern PP. As a result of the planarization process, a portion of the first interlayer insulating layer 110 and the hard mask pattern MP, which are located at a level higher than the top surface of the sacrificial pattern PP, may be removed.

Thereafter, the sacrificial pattern PP and the second semiconductor patterns SP2 may be selectively removed. As a result of the removal of the sacrificial pattern PP, the first empty space ES1 may be formed. As a result of the removal of the second semiconductor patterns SP2, the second empty spaces ES2 may be formed. During the formation of the first and second empty spaces ES1 and ES2, the silicide patterns SC may be covered with the first interlayer insulating layer 110 or may not be removed.

Referring to FIGS. 15A and 15B, the gate electrode GE may be formed to fill the first and second empty spaces ES1 and ES2, and the gate capping pattern GP may be formed on the gate electrode GE.

Thereafter, contact holes CTH may be formed to penetrate the first interlayer insulating layer 110. The contact holes CTH may be formed at opposite sides of the gate electrode GE to expose at least a portion of the silicide patterns SC. The present invention is not limited thereto. In an embodiment, referring to FIG. 15B, a portion of each of the silicide patterns SC may not be exposed to the contact hole CTH and may be covered with the first interlayer insulating layer 110.

Referring to FIG. 4, the active contacts AC may be formed to fill the contact holes CTH. The formation of the active contacts AC in the contact holes CTH may include depositing a semiconductor layer between the silicide patterns SC and the top surfaces SDt of the source/drain patterns SD through a metal-induced crystallization process based on the silicide patterns SC, which are exposed by the contact holes CTH, and performing a silicidation process or a high-concentration impurity doping process on the semiconductor layer between the silicide patterns SC and the top surfaces SDt of the source/drain patterns SD. The semiconductor layer may include or may be formed of silicon or germanium. In some embodiments, the metal-induced crystallization process may include depositing an amorphous semiconductor layer between the silicide patterns SC and the top surfaces SDt of the source/drain patterns SD, and performing a heat treatment on the amorphous semiconductor layer, thereby crystallizing the amorphous semiconductor layer induced by the silicide patterns SC into a polycrystalline phase layer. The heat treatment may be performed at a temperature lower compared to a crystallization process performed without the silicide patterns SC. The silicidation process or the high-concentration impurity doping process may be performed on the crystallized semiconductor layer by the metal-induced crystallization process.

Figure 16A:
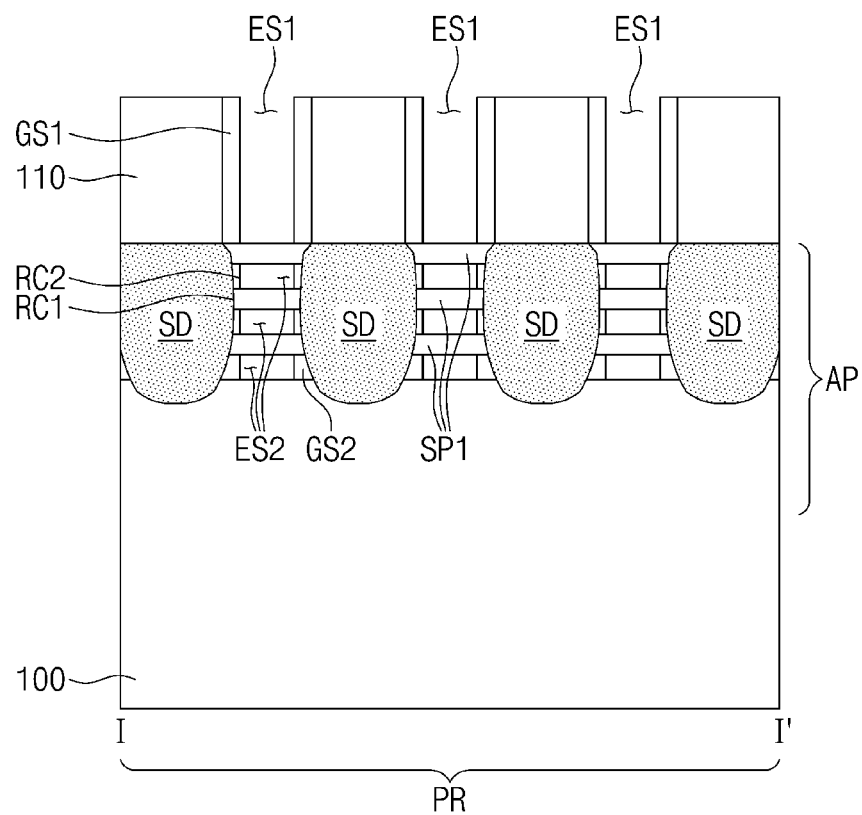
Figure 16A:
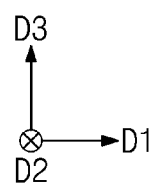
Figure 16B:
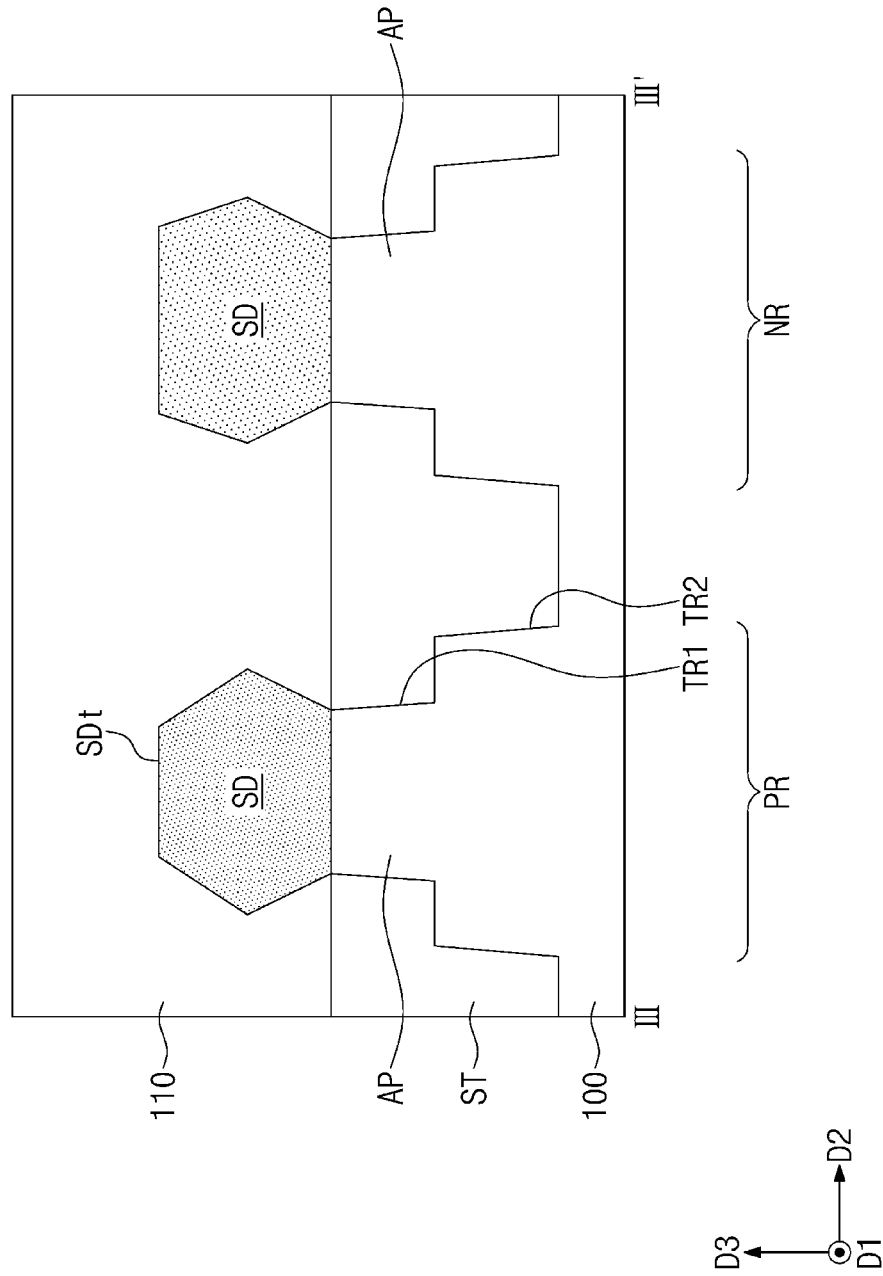
Figure 17A:
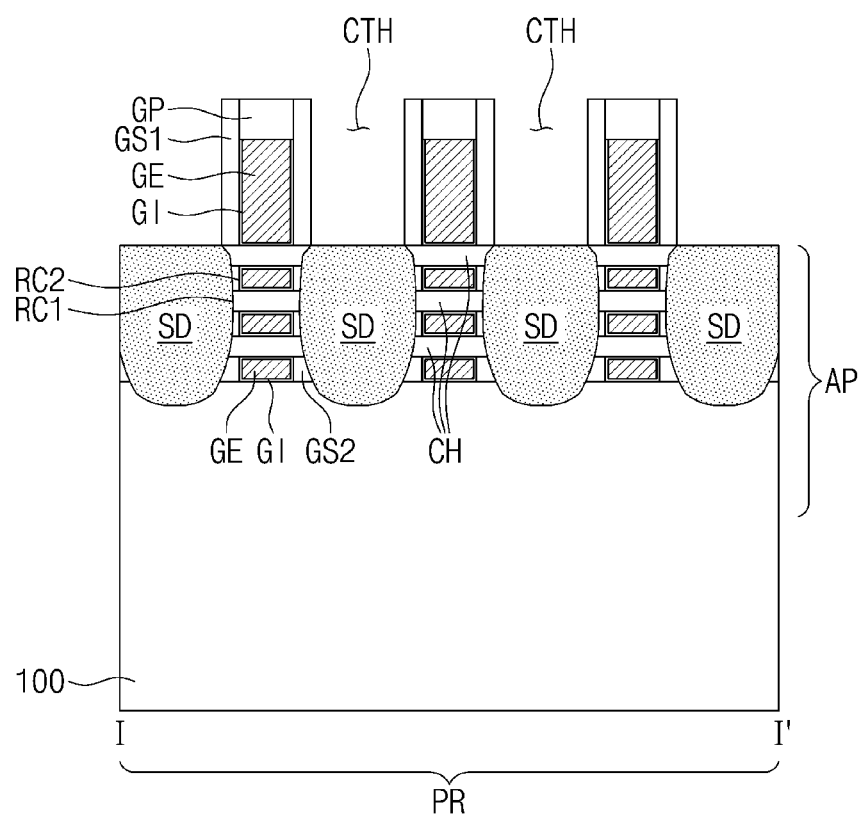
Figure 17A:
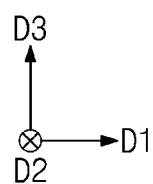
Figure 17B:
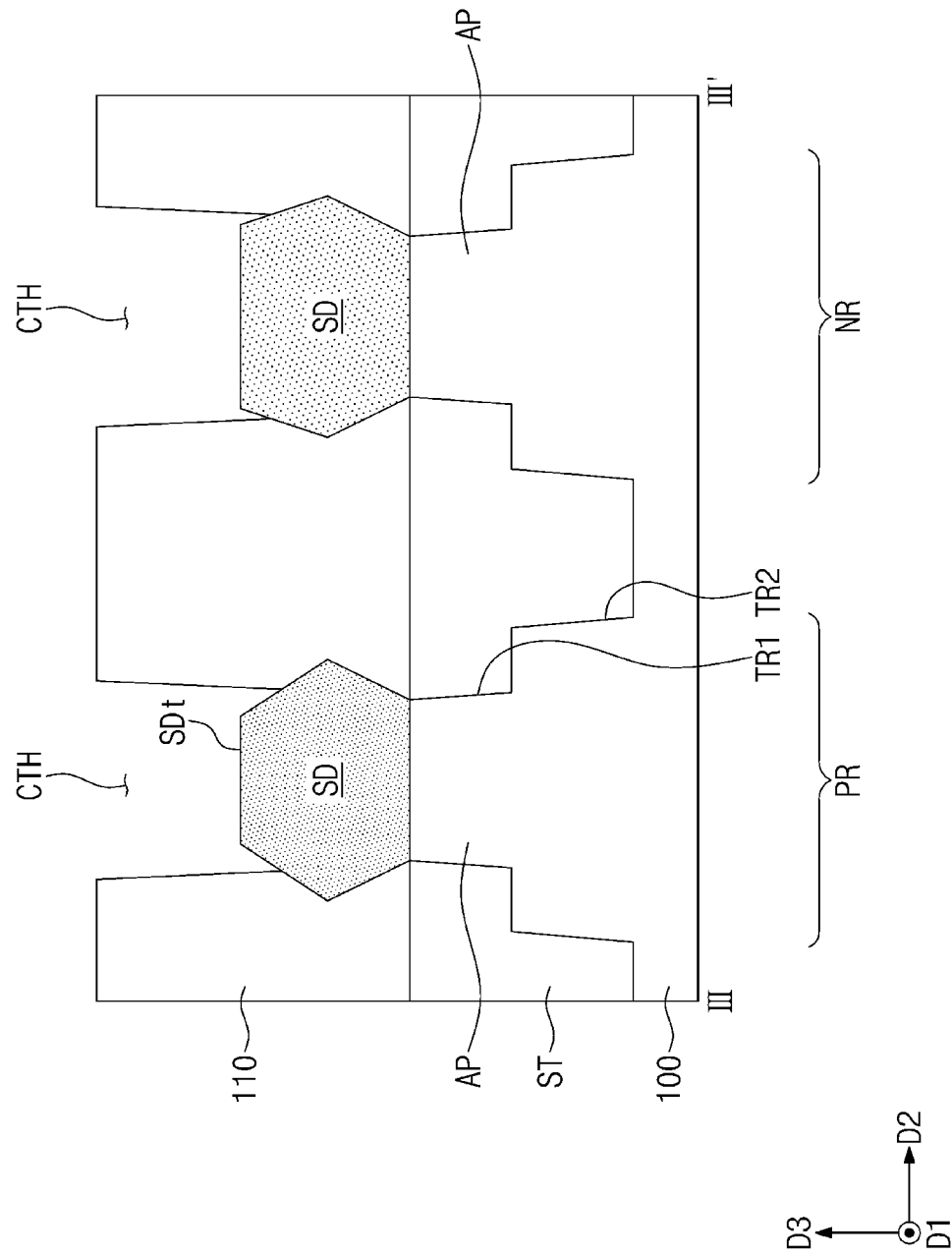

FIGS. 16A and 17A are sectional views, which are respectively taken along the line I-I' of FIG. 13A to illustrate a method of fabricating a semiconductor device according to an embodiment of the inventive concept. FIGS. 16B and 17B are sectional views, which are respectively taken along the line of FIG. 13A to illustrate a method of fabricating a semiconductor device according to an embodiment of the inventive concept. For convenience in description, a description of the steps corresponding to FIGS. 5A to 7C will be omitted, and the steps corresponding to FIGS. 7A, 7B, and 7C and subsequent steps will be described in more detail below.

Referring to FIGS. 16A and 16B with FIGS. 7A, 7B, and 7C, the first interlayer insulating layer 110 may be formed to cover the top surfaces SDt of the source/drain patterns SD. The first interlayer insulating layer 110 may cover the top surface of the gate capping pattern GP, the top and side surfaces of the first gate spacers GS1, and the top surface of the device isolation layer ST.

Next, a planarization process may be performed to expose the top surface of the sacrificial pattern PP. As a result of the planarization process, a portion of the first interlayer insulating layer 110 and the hard mask pattern MP, which are located at a level higher than the top surface of the sacrificial pattern PP, may be removed.

Thereafter, the sacrificial pattern PP and the second semiconductor patterns SP2 may be selectively removed. As a result of the removal of the sacrificial pattern PP, the first empty space ES1 may be formed. As a result of the removal of the second semiconductor patterns SP2, the second empty spaces ES2 may be formed.

Referring to FIGS. 17A and 17B, the gate electrode GE may be formed to fill the first and second empty spaces ES1 and ES2, and the gate capping pattern GP may be formed on the gate electrode GE.

Thereafter, the contact holes CTH may be formed to penetrate the first interlayer insulating layer 110. The contact holes CTH may be formed at opposite sides of the gate electrode GE to expose at least a portion of each of the top surfaces SDt of the source/drain patterns SD to the outside. The present invention is not limited thereto. In an embodiment, as shown in FIG. 15B, another portion of each of the top surfaces SDt of the source/drain patterns SD may not be exposed to the contact holes CTH and may be covered with the first interlayer insulating layer 110.

Referring back to FIG. 4, the active contacts AC may be formed to fill the contact holes CTH. However, the silicide patterns SC between the first interlayer insulating layer 110 and the source/drain patterns SD may not be provided, unlike the structure shown in FIG. 4. The formation of the active contacts AC may include forming the silicide patterns SC on the top surfaces SDt of the source/drain patterns SD, which are exposed through the contact holes CTH, depositing a silicon or germanium layer between the silicide patterns SC and the top surfaces SDt of the source/drain patterns SD through a metal-induced crystallization process based on the silicide patterns SC, and performing a silicidation process or a high-concentration impurity doping process on the silicon or germanium layer between the silicide patterns SC and the top surfaces SDt of the source/drain patterns SD, similar to the method described with reference to FIGS. 8A, 8B, 9A, and 9B.

Figure 18A:
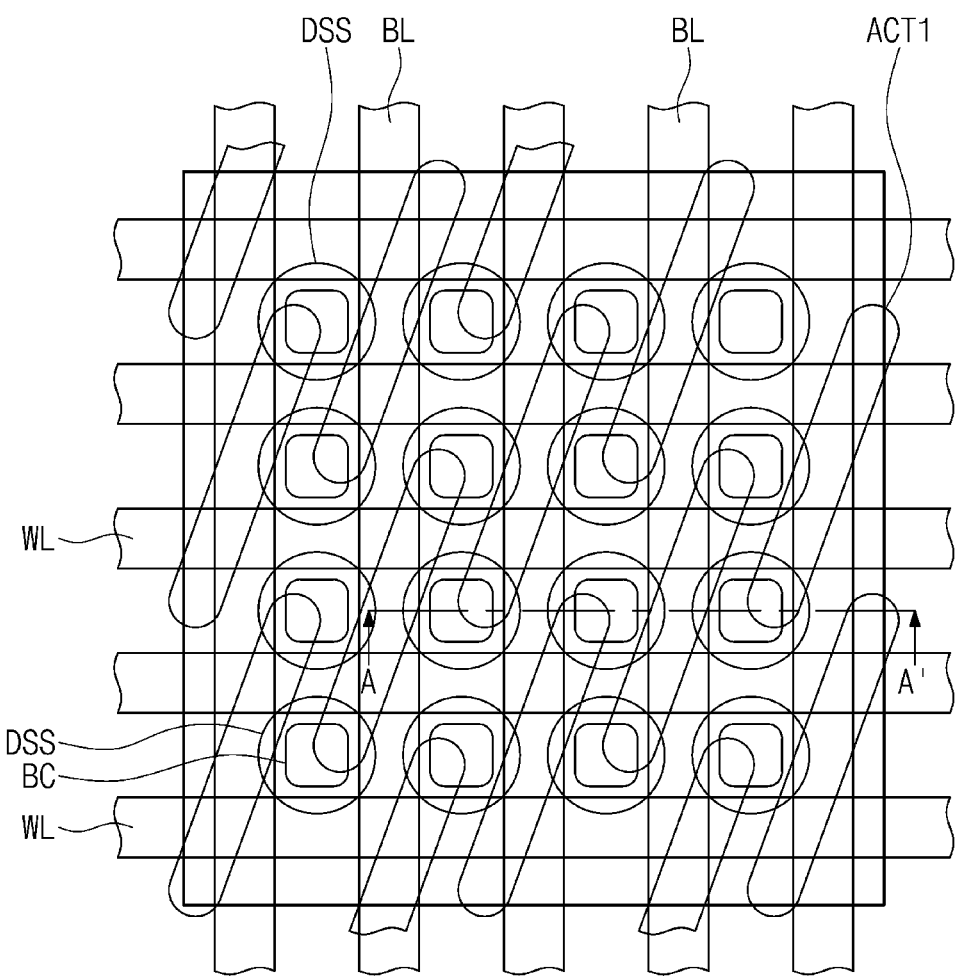
FIGS. 18A and 19A are plan views illustrating a semiconductor memory device according to an embodiment of the inventive concept.
Figure 18B:
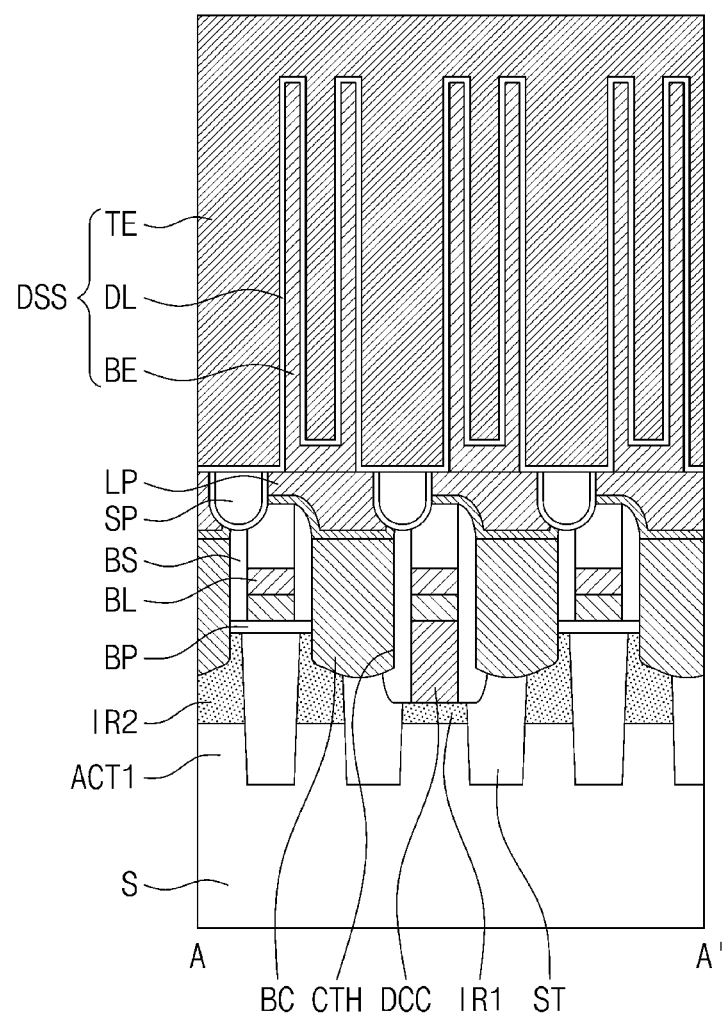
FIGS. 18B and 19B are sectional views, which are respectively taken along line A-A' of FIG. 18A and line B-B' of FIG. 19A to illustrate a semiconductor memory device according to an embodiment of the inventive concept.

FIG. 18A is a plan view illustrating a semiconductor memory device according to an embodiment of the inventive concept. FIG. 18B is a sectional view, which is taken along line A-A' of FIG. 18A to illustrate a semiconductor memory device according to an embodiment of the inventive concept.

Referring to FIGS. 18A and 18B, the semiconductor memory device may include a substrate S, first active regions ACT1 defined by a device isolation layer ST on the substrate S, cell transistors on the first active regions ACT1, and a data storage structure DSS connected to the cell transistors.

The substrate S may be a semiconductor substrate. The first active regions ACT1, which are provided in an upper portion of the substrate S, may be bar-shaped regions, which are horizontally spaced apart from each other, and may extend in a first direction D1 that is parallel to a top surface of the substrate S. The first direction D1 may be a direction, which is parallel to the top surface of the substrate S and is not perpendicular to both of second and third directions D2 and D3 parallel to the top surface of the substrate S. First impurity regions IR1 and second impurity regions IR2 may be provided in the first active regions ACT1. The first impurity regions IR1 and the second impurity regions IR2 may have a conductivity type that is different from a conductivity type of the substrate S.

A pair of word lines WL may be provided on each of the first active regions ACT1. The word lines WL may be buried in an upper portion of the substrate S and may extend in the second direction D2 to cross the first active regions ACT1. The word lines WL may be spaced apart from each other in the third direction D3.

A buffer pattern BP may be provided on the top surface of the substrate S. Bit line contacts DCC may be provided on the first active regions ACT1. The bit line contacts DCC may be provided to penetrate the buffer pattern BP and may extend in a fourth direction D4 perpendicular to the top surface of the substrate S. The bit line contacts DCC may be connected to the first impurity regions IR1, respectively.

Bit lines BL may be provided to cross the word lines WL or to extend in the third direction D3. The bit lines BL may be spaced apart from each other in the second direction D2. The bit lines BL may be provided to cross a plurality of the first active regions ACT1. The bit lines BL may be in contact with the buffer pattern BP and the bit line contacts DCC. Each of the bit lines BL may include a first conductive pattern, a second conductive pattern, and a capping pattern, which are sequentially stacked on each other. Spacers BS may be provided to cover opposite side surfaces of the first and second conductive patterns and the capping pattern. Node contacts BC, which are connected to the data storage structure DSS, may be provided between adjacent ones of the bit lines BL. The node contacts BC may be connected to the second impurity regions IR2, respectively.

Landing pads LP may be provided on the node contacts BC. The landing pads LP may be spaced apart from each other by a separation pattern SP. The data storage structure DSS may be provided on the landing pads LP. In an embodiment, the data storage structure DSS may be a capacitor. The data storage structure DSS may include a bottom electrode BE, a top electrode TE, and a dielectric layer DL between the bottom electrode BE and the top electrode TE. In an embodiment, the data storage structure DSS may further include supporting patterns that are provided to support a side surface of the bottom electrode BE.

Here, the formation of the node contacts BC may include forming silicide patterns SC on the top surfaces of the second impurity regions IR2 and the top surface of the device isolation layer ST exposed through contact holes CTH, depositing a silicon or germanium layer between the silicide patterns SC and bottom surfaces of the contact holes CTH through a metal-induced crystallization process based on the silicide patterns SC, and performing a silicidation process or a high-concentration impurity doping process on the silicon or germanium layer between the silicide patterns SC and the bottom surfaces of the contact holes CTH, similar to the method as described with reference to FIGS. 8A, 8B, 9A, and 9B. As a result of the metal-induced crystallization process, it may be possible to quickly and cost-effectively form the node contacts BC in the contact holes CTH.

Figure 19A:
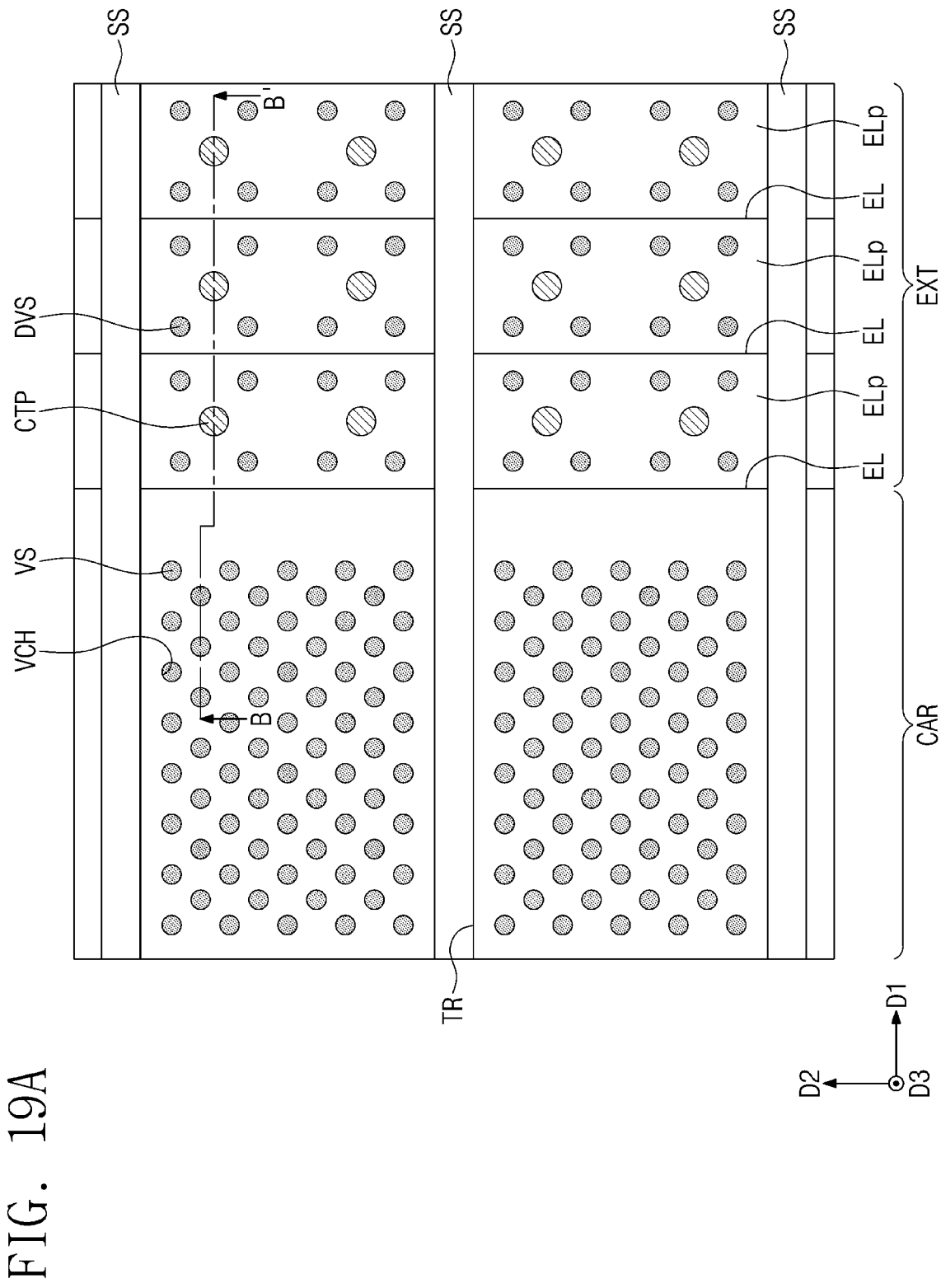
Figure 19B:
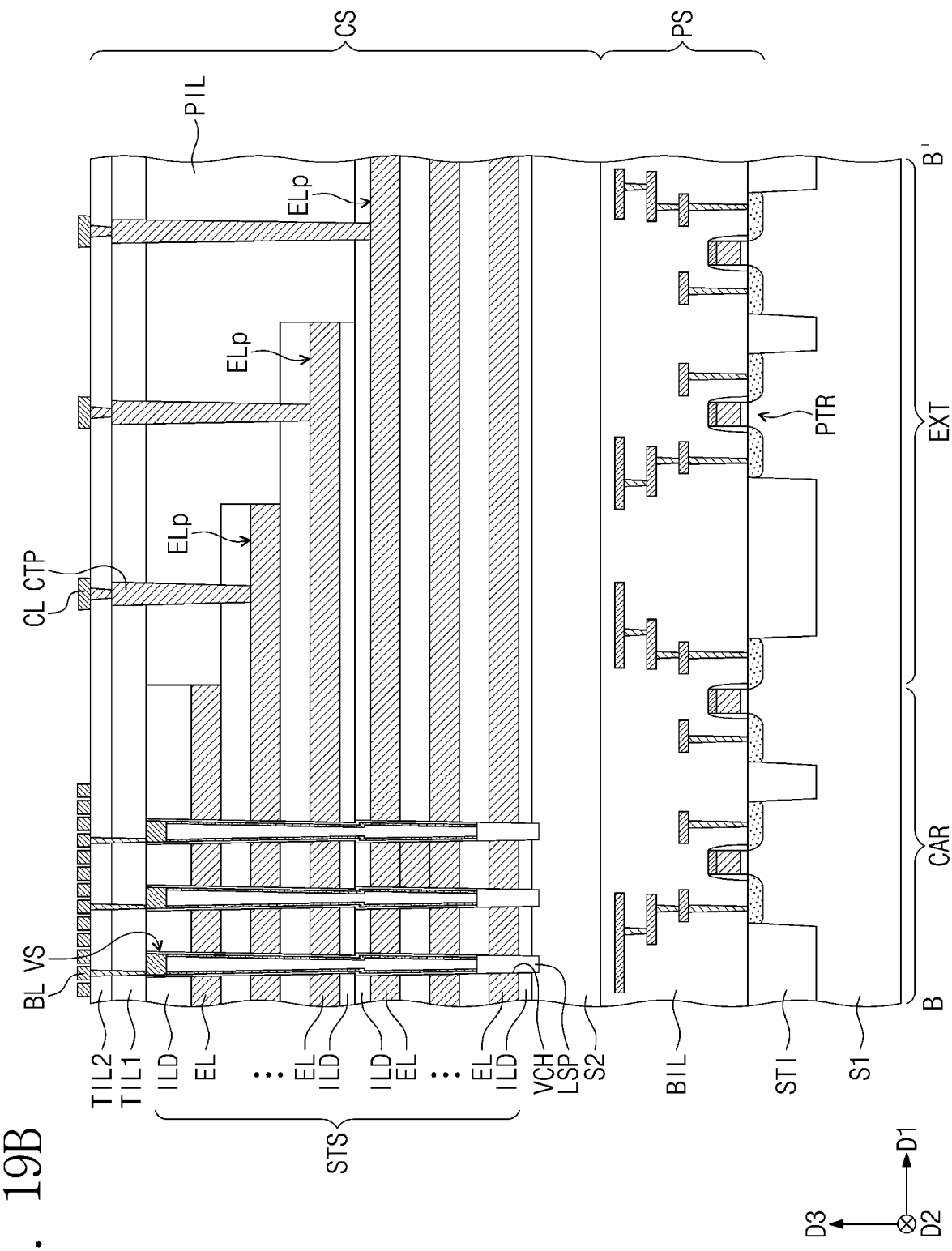

FIG. 19A is a plan view illustrating a semiconductor memory device according to an embodiment of the inventive concept. FIG. 19B is a sectional view, which is taken along line A-A' of FIG. 19A to illustrate a semiconductor memory device according to an embodiment of the inventive concept.

Referring to FIGS. 19A and 19B, a first substrate S1 including a cell array region CAR and an extension region EXR may be provided. The first substrate S1 may extend in first and second directions D1 and D2, which are not parallel to each other.

The extension region EXR may extend from the cell array region CAR in the first direction D1. The cell array region CAR may be a region, on which vertical channel structures VS, which will be described below, are provided. The extension region EXR may be a region provided with the staircase structure including pad portions Elp, which will be described below.

The first substrate S1 may be a semiconductor substrate. A device isolation layer ST may be provided in the first substrate S1. The device isolation layer ST may define an active region of the first substrate S1. A peripheral circuit structure PS may be provided on the first substrate S1. The peripheral circuit structure PS may include peripheral circuit transistors PTR on the active region of the first substrate S1 and a lower insulating layer BIL covering the peripheral circuit transistors PTR. Each of the peripheral circuit transistors PTR may be, for example, an NMOS transistor, or a PMOS transistor. In some embodiment, each peripheral circuit transistor PTR may be a gate-all-around type transistor.

A cell array structure CS, which includes a second substrate S2, a stack STS, separation structures SS, vertical channel structures VS, and contact plugs CTP, may be provided on the peripheral circuit structure PS. The cell array structure CS will be described below.

The second substrate S2 may be provided on the cell array region CAR and the extension region EXR to cover the lower insulating layer BIL. The second substrate S2 may extend in the first and second directions D1 and D2. The second substrate S2 may be a semiconductor substrate. The stack STS may be provided on the second substrate S2. The stack STS may extend from the cell array region CAR toward the extension region EXR in the first direction D1.

In an embodiment, a plurality of stacks ST, which are arranged in the second direction D2, may be provided. When viewed in a plan view, the separation structures SS may be provided in trenches TR, which are provided between the stacks STS and extend in the first direction D1. The separation structures SS may extend from the cell array region CAR to the extension region EXR. The stacks STS may be spaced apart from each other in the second direction D2, with one of the separation structures SS interposed therebetween.

For convenience in description, one of the stacks ST and one of the separation structures SS will be described below, but the others of the stacks ST and the others of the separation structures SS may be configured to have the same features. [Stop Here]

The stack STS may include interlayer insulating layers ILD and gate electrodes EL, which are alternately and repeatedly stacked on each other. Lengths of the gate electrodes EL in the first direction D1 may decrease in a third direction D3. The gate electrodes EL may have the pad portions Elp on the extension region EXR. The pad portions Elp of the gate electrodes EL may be disposed at positions that are different from each other in horizontal and vertical directions. The pad portions Elp may form a staircase structure in the first direction D1. Due to the staircase structure, a thickness of the stack STS may decrease with increasing distance from the outermost one of the vertical channel structures VS. The interlayer insulating layers ILD may be provided between the gate electrodes EL.

The vertical channel structures VS may be provided on the cell array region CAR to penetrate the stack STS and to be in contact with the second substrate S2. The vertical channel structures VS may be provided to penetrate at least a portion of the second substrate S2, and each of the vertical channel structures VS may have a bottom surface that is located at a level lower than a top surface of the second substrate S2.

The vertical channel structures VS may be provided to form a zigzag arrangement in the first direction D1 or the second direction D2, when viewed in a plan view. The vertical channel structures VS may be provided vertical channel holes VCH, which are formed to penetrate the stack STS.

Each of the vertical channel structures VS may include a lower semiconductor pattern LSP, which is provided to fill a lower portion of each of the vertical channel holes VCH and to be in contact with the second substrate S2, a data storage pattern, which is provided to cover an inner side surface of each of the vertical channel holes VCH, a vertical semiconductor pattern, which is provided to conformally cover an inner side surface of each of the vertical channel holes VCH, a gapfill insulating pattern, which is provided to fill an internal space enclosed by the vertical semiconductor pattern, and a conductive pad, which is provided in a space enclosed by the gapfill insulating pattern and the data storage pattern. The vertical semiconductor pattern may be in contact with the lower semiconductor pattern LSP.

A plurality of dummy vertical channel structures DVS may be provided on the extension region EXR to penetrate a planarization insulating layer PIL, which will be described below, and the stack STS. More specifically, the dummy vertical channel structures DVS may be provided to penetrate the pad portions Elp of the gate electrodes EL. The dummy vertical channel structures DVS may be provided near the contact plugs CTP, which will be described below. The dummy vertical channel structures DVS may not be provided on the cell array region CAR. The dummy vertical channel structures DVS and the vertical channel structures VS may be formed at the same time and may have substantially the same structure. The present invention is not limited thereto. In an embodiment, the dummy vertical channel structures DVS may not be provided. As used herein, the term "dummy" is used to refer to a component that has the same or similar structure and shape as other components but does not have a substantial function and exists only as a pattern in the device.

The planarization insulating layer PIL may be provided on the extension region EXR to cover the staircase structure of the stack STS. The planarization insulating layer PIL may have a substantially flat top surface. First and second upper insulating layers TIL1 and TIL2 may be sequentially formed on the stack STS and the planarization insulating layer PIL.

The separation structure SS may be provided to penetrate the first upper insulating layer TIL1 and the stack STS. The separation structure SS may further penetrate the planarization insulating layer PIL on the extension region EXR. The separation structure SS may be spaced apart from the vertical channel structures VS in the second direction D2.

The contact plugs CTP may be provided on the extension region EXR to penetrate the first upper insulating layer TIL1 and the planarization insulating layer PIL. Each of the contact plugs CTP may further penetrate one of the interlayer insulating layers ILD of the stacks STS and may be in contact with and be electrically connected to one of the gate electrodes EL. The contact plugs CTP may be provided on the pad portions Elp. The contact plugs CTP may be spaced apart from the dummy vertical channel structures DVS. A height of each of the contact plugs CTP in the third direction D3 may increase with increasing distance from the outermost one of the vertical channel structures VS. Bit lines BL, which are electrically connected to the vertical channel structures VS, and conductive lines CL, which are electrically connected to the contact plugs CTP, may be provided on the second upper insulating layer TIL2. The bit lines BL and the conductive lines CL may be formed of or may include at least one of conductive materials (e.g., metal).

In some embodiments, the formation of the lower semiconductor pattern LSP in the lower portion of each of the vertical channel holes VCH may include forming silicide patterns SC on the top surface of the second substrate S2 exposed through the vertical channel holes VCH, depositing a silicon or germanium layer between the silicide patterns SC and bottom surfaces of the vertical channel holes VCH through a metal-induced crystallization process based on the silicide patterns SC, and performing a silicidation process or a high-concentration impurity doping process on the silicon or germanium layer between the silicide patterns SC and the bottom surfaces of the vertical channel holes VCH, similar to the method as described with reference to FIGS. 8A, 8B, 9A, and 9B. As a result of the metal-induced crystallization process, it may be possible to quickly and cost-effectively form the lower semiconductor pattern LSP in the lower portion of each of the vertical channel holes VCH.

According to an embodiment of the inventive concept, a semiconductor device may include active contacts which are formed in a self-aligned manner. For example, the active contacts (or preliminary active contacts) may be formed by a metal-induced crystallization (MIC) process using a silicide pattern, which is formed on source/drain patterns, and the active contacts may be more accurately formed in a self-aligned manner. The increase in the accuracy of the alignment process may lead to a reduction in electric resistance between the source/drain patterns and the active contacts and may increase a margin between the active and gate contacts. Accordingly, it may be possible to improve reliability and electrical characteristics of the semiconductor device.

Since the active contact is formed without a photolithography process, it may be possible to increase a turnaround time for a fabrication process and to reduce costs for the fabrication process.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor device, comprising:
an active pattern extending in a first direction on a substrate;
a pair of source/drain patterns provided on the active pattern and spaced apart from each other in the first direction;
a plurality of channel layers stacked on the active pattern to be vertically spaced apart from each other and connecting the pair of source/drain patterns with each other;
a gate electrode provided at the active pattern between the pair of source/drain patterns, wherein the gate electrode extends in a second direction intersecting the first direction and surrounds each of the plurality of channel layers; and a pair of active contacts provided at opposite sides of the gate electrode, respectively, wherein each active contact of the pair of active contacts covers inclined top surfaces, relative to a top surface of the substrate, of a corresponding source/drain pattern of the pair of source/drain patterns, respectively, wherein the inclined top surfaces are spaced apart from each other in the second direction, wherein a width, in the second direction, of each of the pair of active contacts is smaller than or equal to a maximum width, in the second direction, of the corresponding source/drain pattern of the pair of source/drain patterns, and wherein each of the pair of active contacts comprises protruding portions that protrudes toward and extends along the inclined top surfaces of the corresponding source/drain pattern of the pair of source/drain patterns.

2. The semiconductor device of claim 1, further comprising:

an interlayer insulating layer covering side surfaces of the pair of source/drain patterns and side surfaces of the pair of active contacts, wherein the protruding portion of each of the pair of active contacts is in contact with the interlayer insulating layer.

3. The semiconductor device of claim 1, wherein a width, in the first direction, of each of the pair of active contacts is smaller than a maximum width, in the first direction, of the corresponding source/drain pattern of the pair of source/drain patterns.

4. The semiconductor device of claim 1, further comprising:

gate spacers covering side surfaces of the gate electrode; and a gate capping pattern on the gate electrode, wherein each of the pair of active contacts fully covers side surfaces of the gate spacers.

5. The semiconductor device of claim 4, wherein each of the pair of active contacts has a top surface that is located at substantially the same level as a top surface of the gate capping pattern.

6. The semiconductor device of claim 1, further comprising:

a pair of silicide patterns on the pair of active contacts, respectively, wherein each of the pair of silicide patterns comprises at least one of gold (Au), silver (Ag), aluminum (Al), zinc (Zn), titanium (Ti), palladium (Pd), tantalum (Ta), and tungsten (W).

7. The semiconductor device of claim 6, wherein the pair of silicide patterns are spaced apart from the pair of source/drain patterns in a third direction, respectively, the third direction being perpendicular to the top surface of the substrate, and wherein each of the pair of active contacts is interposed between the corresponding source/drain pattern of the pair of source/drain patterns and a corresponding silicide pattern of the pair of silicide patterns.

8. The semiconductor device of claim 1, wherein each of the pair of active contacts has a decreasing width in a third direction perpendicular to the top surface of the substrate, the decreasing width being measured in the second direction.

9. The semiconductor device of claim 8, wherein a side surface of each of the pair of active contacts has a slope relative to the third direction.

10. The semiconductor device of claim 1, wherein each of the pair of active contacts has an increasing width in a third direction perpendicular to the top surface of the substrate, the increasing width being measured in the second direction, and a mean value of the width, in the second direction, of each of the pair of active contacts is smaller than the maximum width, in the second direction, of the corresponding source/drain pattern of the pair of source/drain patterns.

11. The semiconductor device of claim 10, further comprising:

a silicide pattern provided on a top surface of each of the pair of source/drain patterns, which are not covered with the pair of active contacts, wherein the silicide pattern is in contact with a portion of a side surface of each of the pair of active contacts.

12. The semiconductor device of claim 1, wherein the pair of active contacts comprise a metal silicide or a highly-doped semiconductor material.

13. The semiconductor device of claim 1, wherein an entirety of each active contact of the pair of active contacts is disposed on a top surface of the corresponding source/drain pattern of the pair of source/drain patterns.

14. A semiconductor device, comprising:

an active pattern extending in a first direction on a substrate;

a pair of source/drain patterns provided on the active pattern and spaced apart from each other in the first direction;

a plurality of channel layers stacked on the active pattern to be vertically spaced apart from each other and connecting the pair of source/drain patterns with each other;

a gate electrode provided at the active pattern between the pair of source/drain patterns, wherein the gate electrode extends in a second direction intersecting the first direction, and surrounds each of the plurality of channel layers;

a pair of active contacts provided at opposite sides of the gate electrode and covering top surfaces of the pair of source/drain patterns, respectively;

a gate insulating pattern interposed between the gate electrode and each of the plurality of channel layers;

a pair of first gate spacers extending vertically from a top surface of an uppermost channel layer of the plurality of channel layers and covering opposite side surfaces of the gate electrode, respectively;

a plurality of second gate spacers provided between each of the pair of source/drain patterns and the gate electrode and vertically overlapped with the pair of first gate spacers;

a gate capping pattern provided between the pair of first gate spacers and covering a top surface of the gate electrode;

an interlayer insulating layer covering side and top surfaces of the pair of active contacts; and a gate contact provided to penetrate the gate capping pattern and the interlayer insulating layer and connected to the gate electrode, wherein a width, in the first direction, of each of the pair of active contacts is smaller than a maximum width, in the first direction, of a corresponding source/drain pattern of the pair of source/drain patterns, wherein a width, in the second direction, of each of the pair of active contacts is smaller than or equal to a maximum width, in the second direction, of the corresponding source/drain pattern of the pair of source/drain patterns, and wherein side surfaces of the pair of active contacts extend in a third direction perpendicular to a top surface of the substrate and cover side surfaces of the pair of first gate spacers, respectively.

\* \* \* \* \*